(12) United States Patent
Glukhoy et al.

(10) Patent No.: US 10,475,628 B2
(45) Date of Patent: Nov. 12, 2019

(54) PLASMA BEAM PENETRATION OF MILLIMETER SCALE HOLES WITH HIGH ASPECT RATIOS

(71) Applicant: Nanocoating Plasma Systems Inc., Fremont, CA (US)

(72) Inventors: Yuri Glukhoy, San Francisco, CA (US); Richard Brewster Main, Newark, CA (US)

(73) Assignee: Main Law Cafe, Hedgesville, WV (US)

( * ) Notice: Subject to any disclaimer, the term of this patent is extended or adjusted under 35 U.S.C. 154(b) by 0 days.

(21) Appl. No.: 16/359,388

(22) Filed: Mar. 20, 2019

(65) Prior Publication Data

US 2019/0221402 A1    Jul. 18, 2019

Related U.S. Application Data

(60) Provisional application No. 62/683,627, filed on Jun. 11, 2018, provisional application No. 62/674,536, filed on May 21, 2018.

(51) Int. Cl.
*H01J 37/32* (2006.01)
*C23C 16/56* (2006.01)
(Continued)

(52) U.S. Cl.
CPC ........ *H01J 37/3288* (2013.01); *C23C 16/405* (2013.01); *C23C 16/4405* (2013.01); *C23C 16/45565* (2013.01); *C23C 16/56* (2013.01); *H01J 37/3211* (2013.01); *H01J 37/3244* (2013.01); *H01J 37/32091* (2013.01); *H01J 37/32348* (2013.01); *H01J 37/32825* (2013.01); *H01J 37/32853* (2013.01); *H01J 37/32467* (2013.01); *H01J 2237/049* (2013.01); *H01J 2237/327* (2013.01); *H01J 2237/3321* (2013.01); *H01J 2237/3327* (2013.01)

(58) Field of Classification Search
CPC ............... H01J 2237/3327; H01J 37/00; H01J 37/3211; H01J 37/32825
See application file for complete search history.

(56) References Cited

U.S. PATENT DOCUMENTS

2013/0105460 A1\* 5/2013 Okumura ............... H01J 37/321
    219/391
2015/0211123 A1\* 7/2015 Glukhoy ............... C23C 16/453
    118/712

\* cited by examiner

*Primary Examiner* — Joel G Horning
(74) *Attorney, Agent, or Firm* — Main Law Cafe

(57) ABSTRACT

An aluminum gas distribution plate refurbishment system combines a multi-beam inductively coupled plasma (AP-ICP) torch and vacuum discharge chuck. Plasma beams are employed to clean and restore to service the many gas flow passages in aluminum type gas distribution plates. Several parallel supersonic plasma beams of uniform density are produced from a single upper and lower AP-ICP plasma reactor arranged in totem pole that are driven by two pairs of opposing spiral planar RF induction RF antennas. These plasma beams are focused inside the gas flow passages to etch, heat, and deposit nanoparticles within. The vacuum discharge chuck includes a capacitively coupled plasma (CCP) reactor to generate a positive species discharge immediately beneath the gas distribution plates. This overcomes and undoes a Debye Sheathing effect, a electron-fed negative space charge blocking occurring above, and unknots any congested plasma beams in the gas flow passages.

9 Claims, 29 Drawing Sheets

(51) Int. Cl.
 *C23C 16/455* (2006.01)
 *C23C 16/40* (2006.01)
 *C23C 16/44* (2006.01)

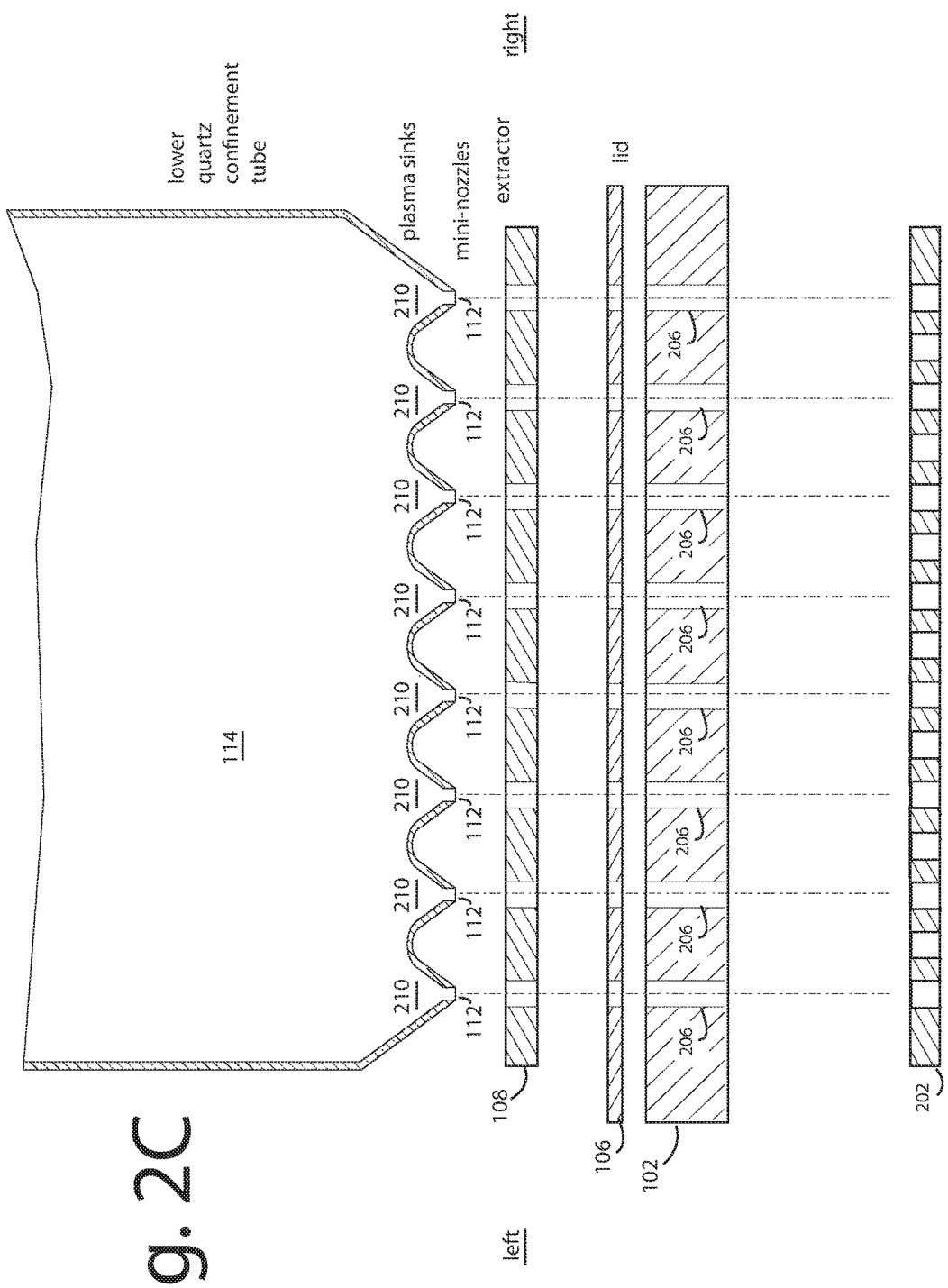

---glass welding---

---glass welding---

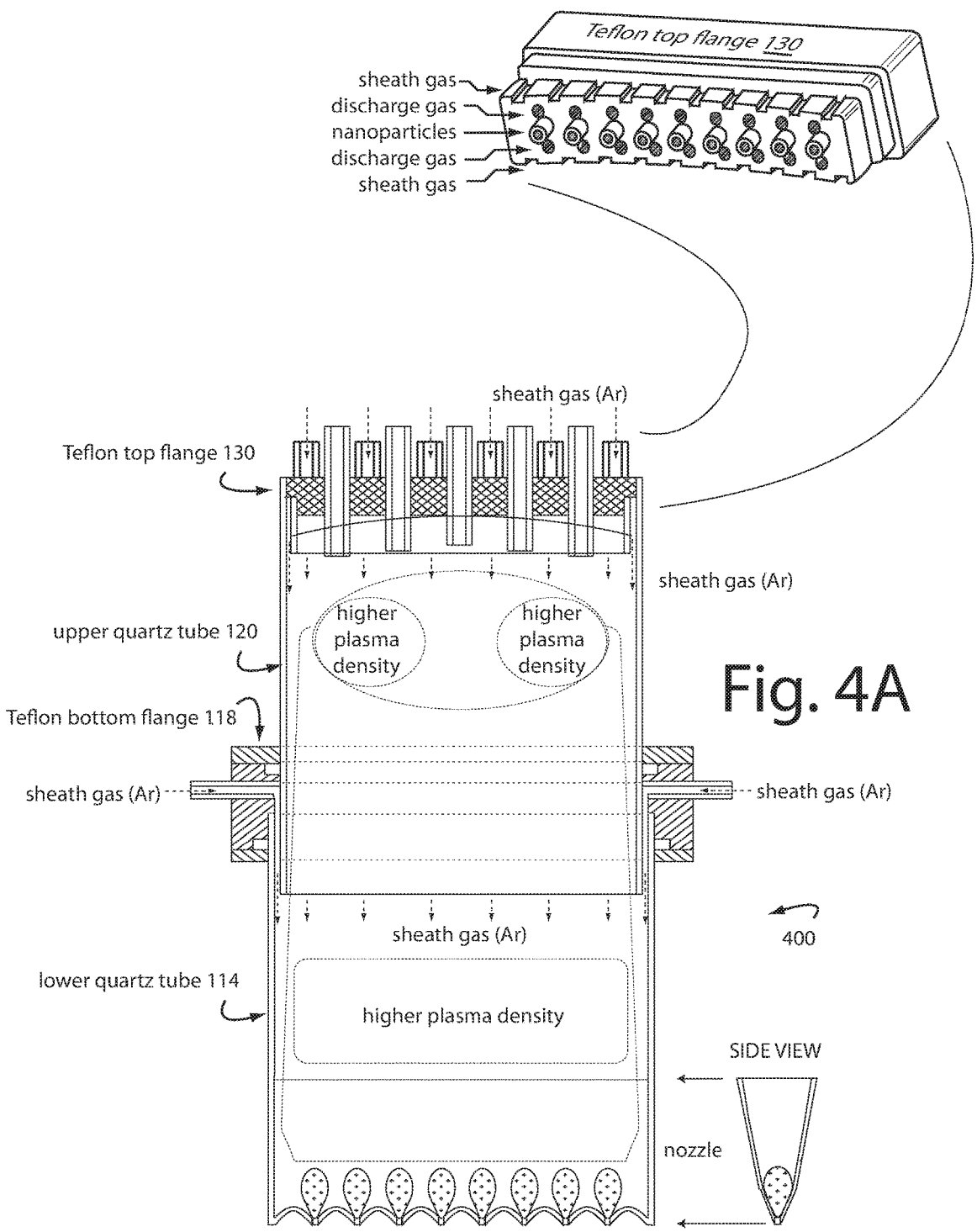

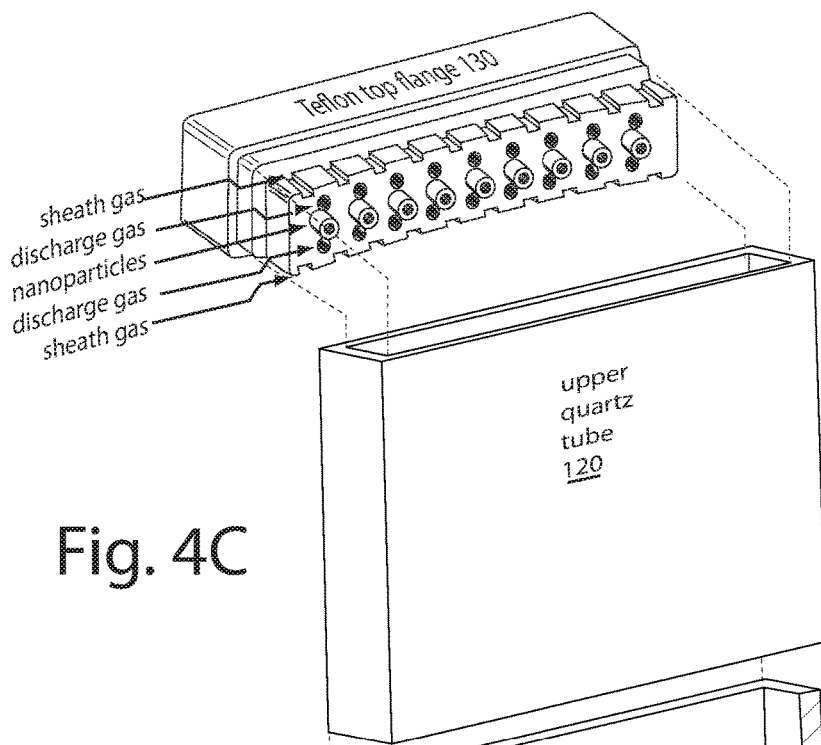
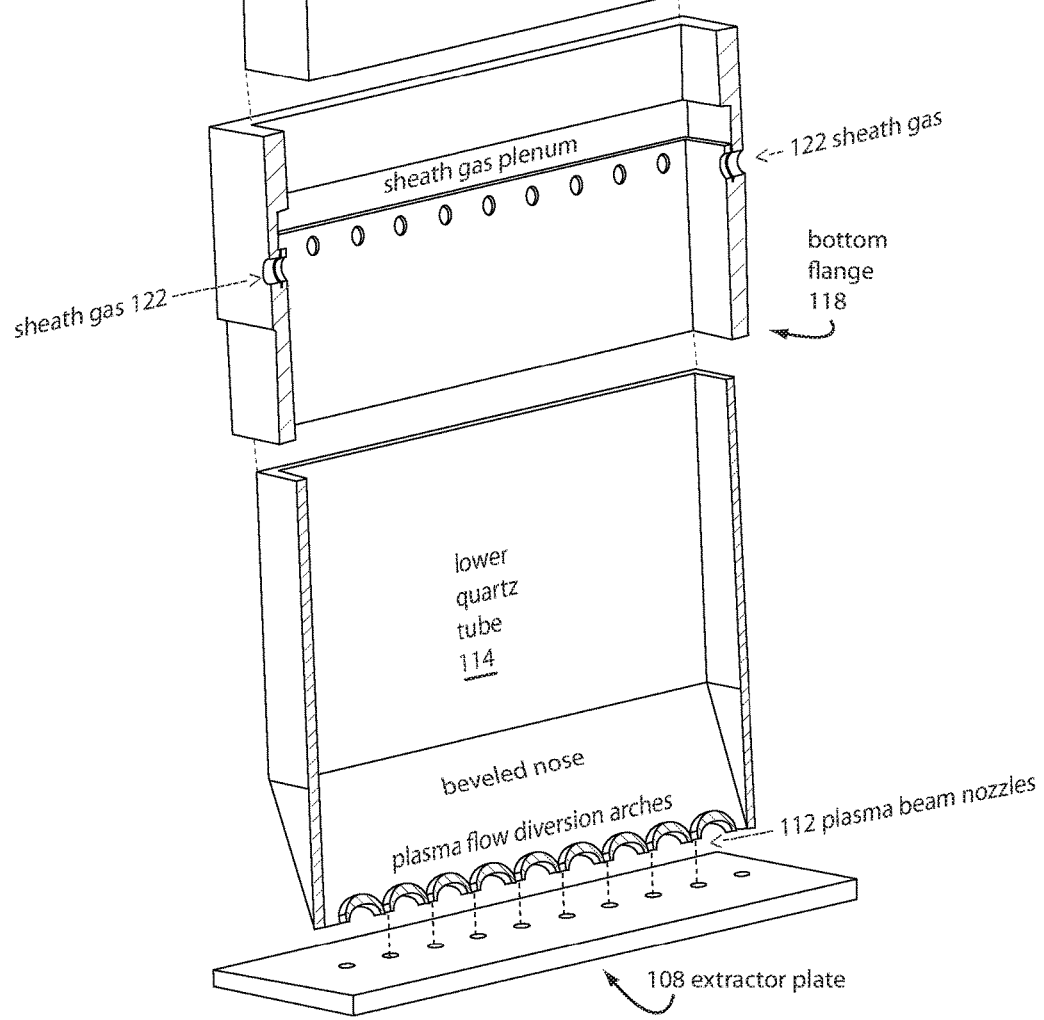
Fig. 4C

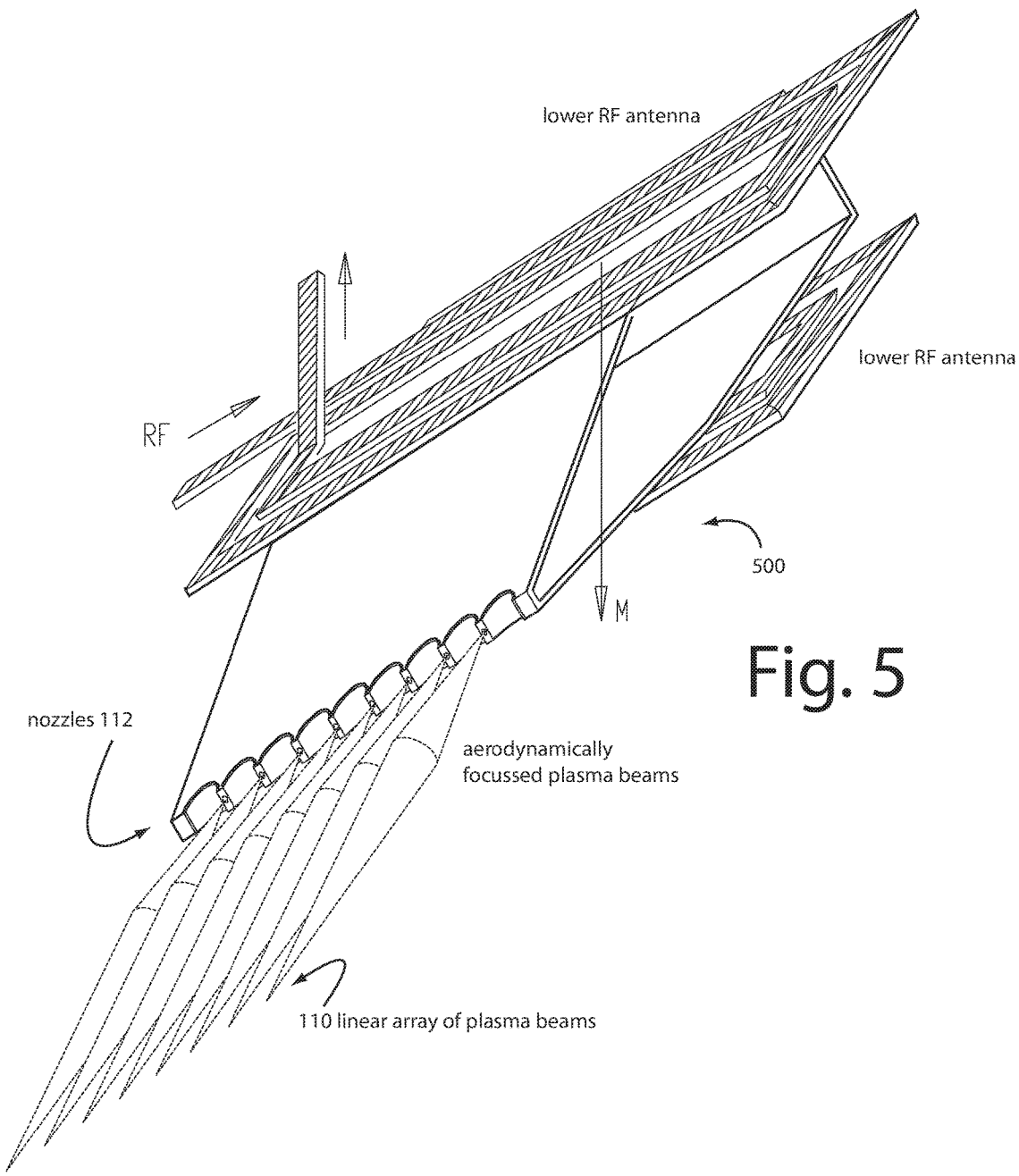

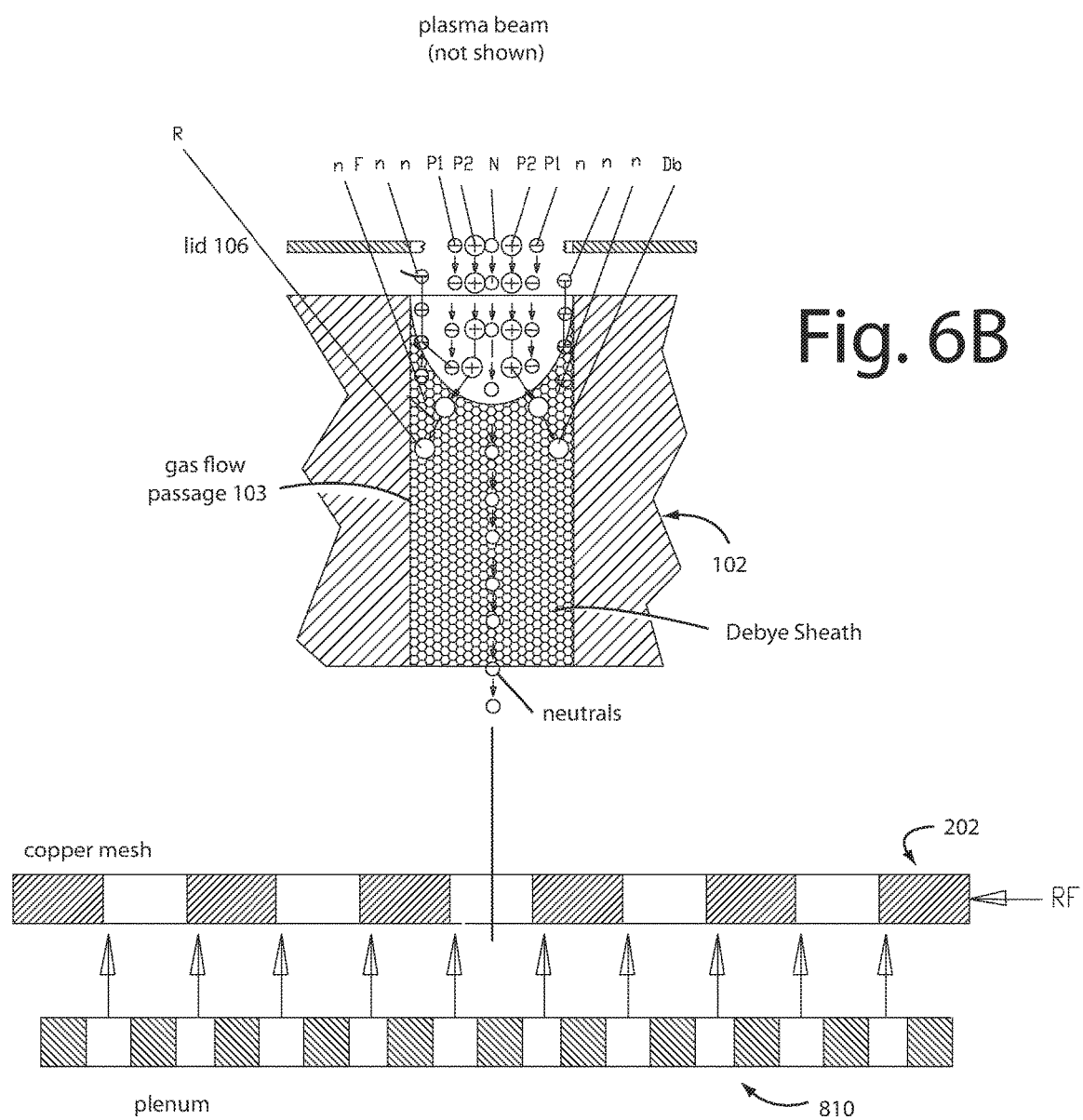

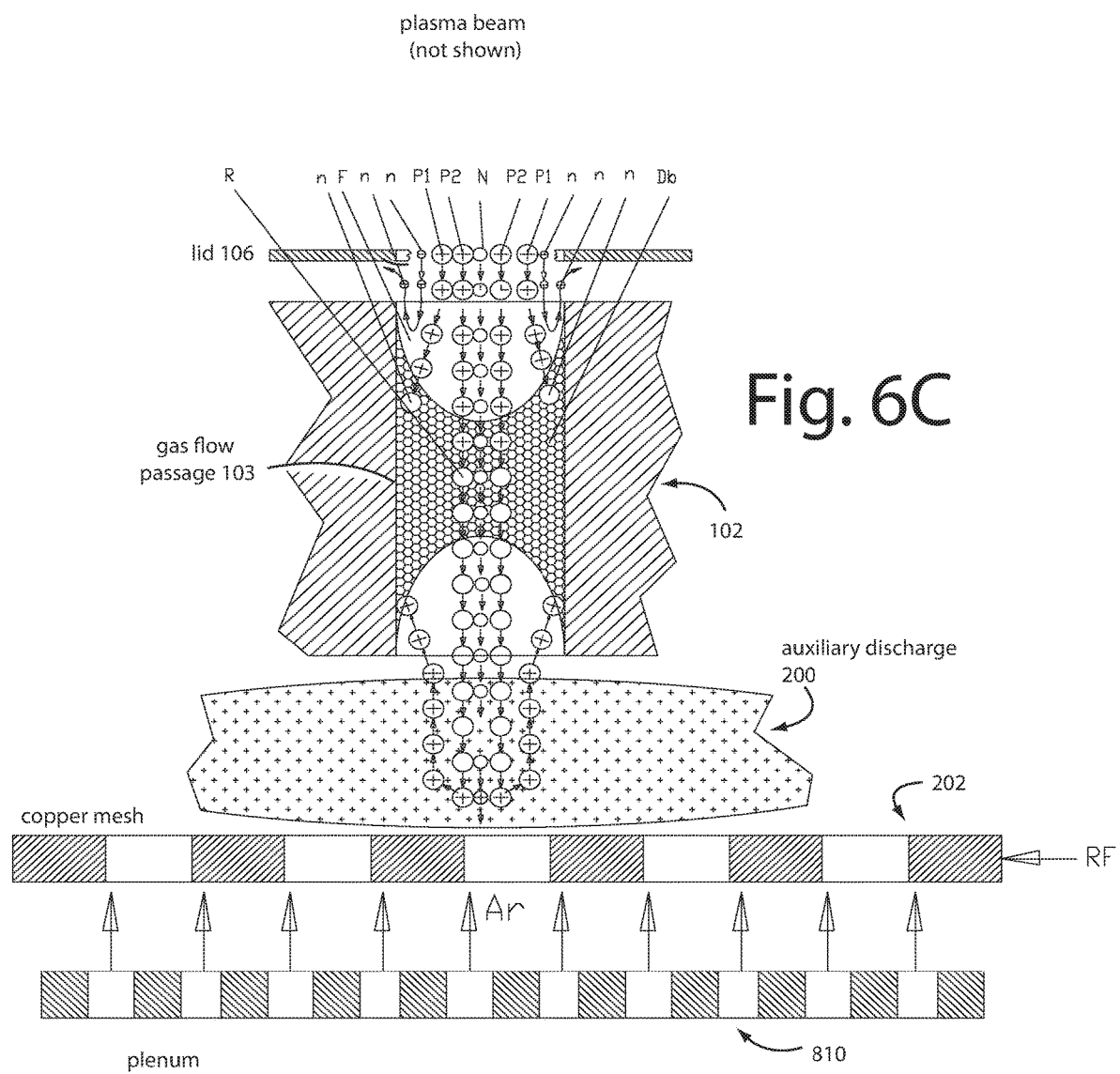

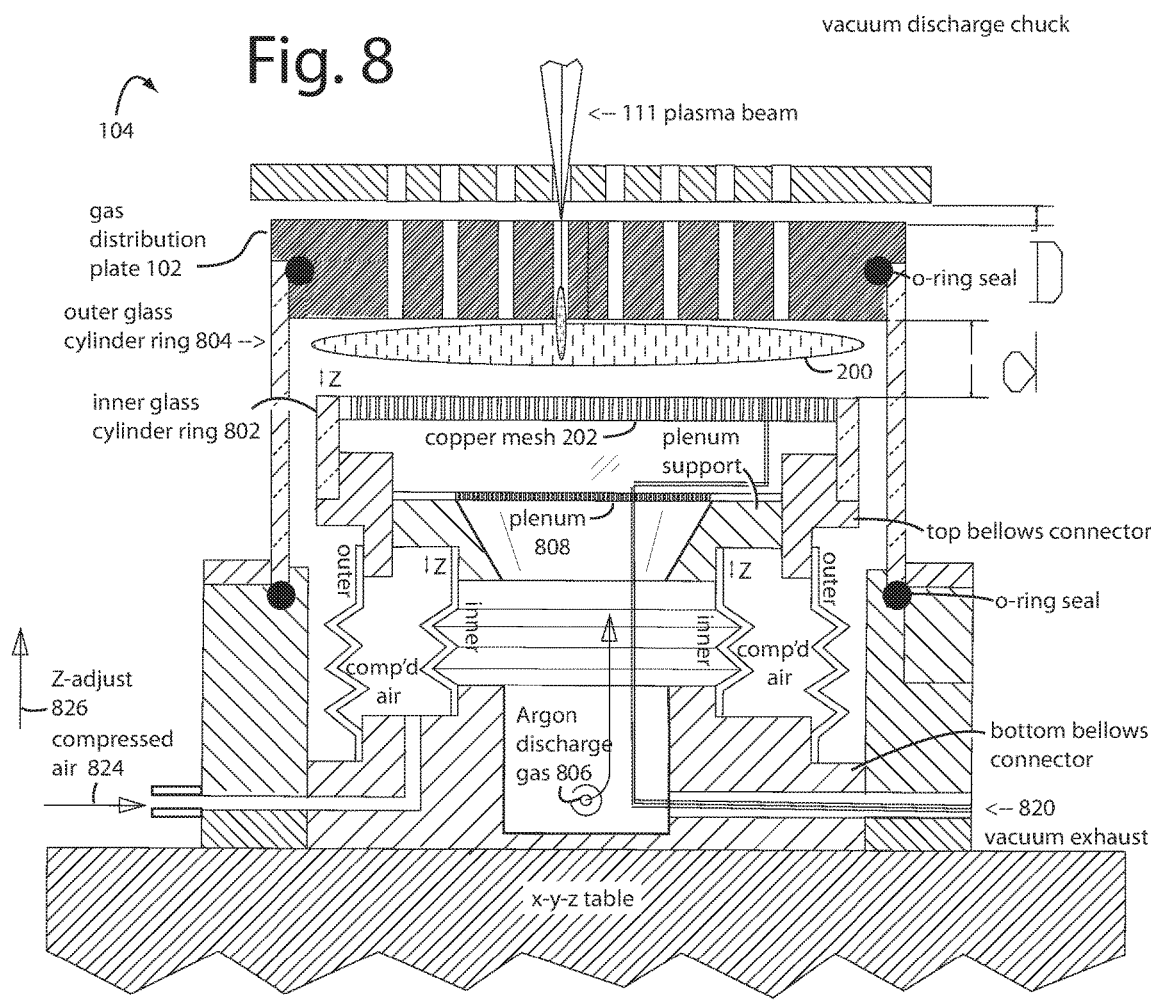

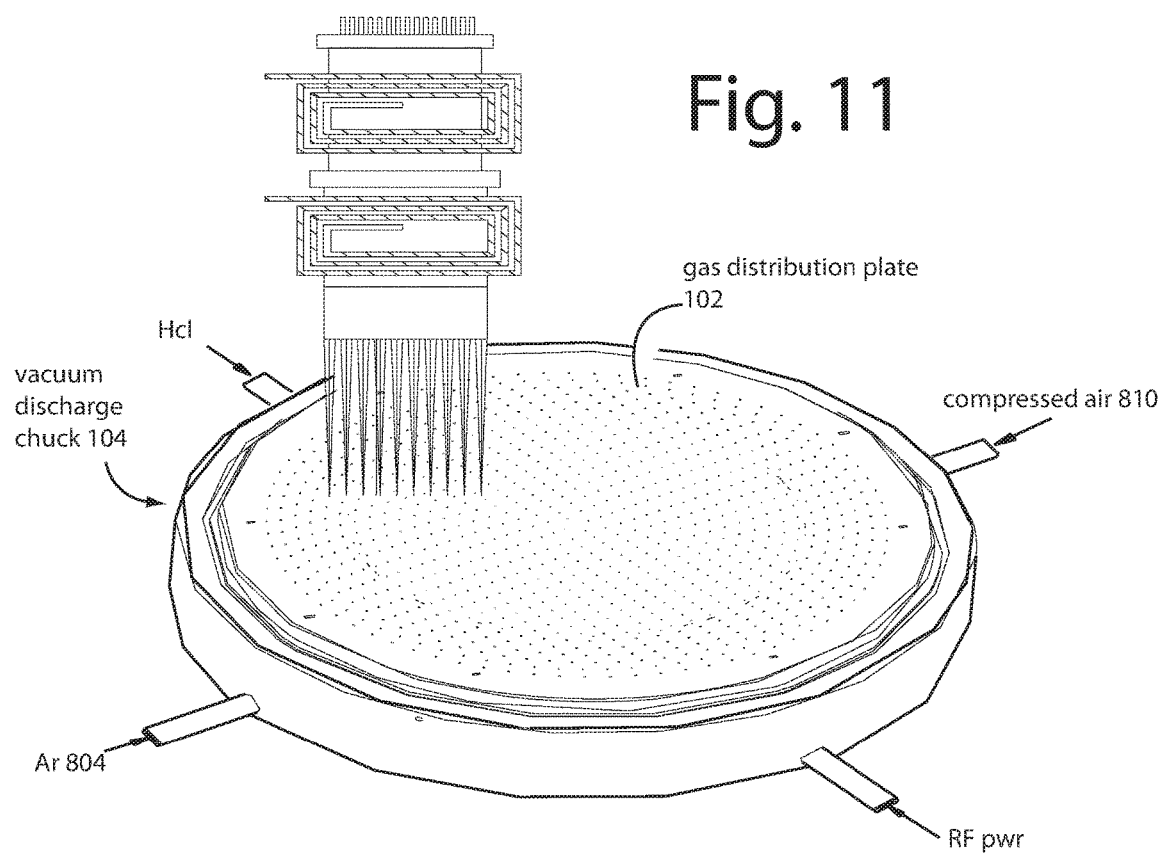

Fig. 13A nanopowder cloud generator

Fig. 13B

Fig. 13C nanopowder cloud generator

PLASMA BEAM PENETRATION OF MILLIMETER SCALE HOLES WITH HIGH ASPECT RATIOS

FIELD OF INVENTION

The present invention relates to atmospheric pressure, inductively coupled plasma (AP-ICP) systems for semiconductor device processing equipment, and more particularly to plasma devices suitable for plasma-based refurbishment systems, tools, and methods to restore worn/damaged aluminum gas distribution plates, aka showerheads, and return them to service.

BACKGROUND

The size of silicon wafers used in semiconductor and integrated circuit manufacturing has grown in diameter now to 450 mm and beyond. Many processes use plasmas generated from gases in clouds over the wafer surface to heat, etch, clean, rinse, and deposit materials on the silicon wafers in dozens of steps to build hundreds, and even millions, of circuits across the surface of each wafer.

As the average diameters of the silicon wafers grew over time, it became increasingly more difficult to maintain process uniformities over the entire working surface. One such difficulty was in providing a uniform discharge gas in which to induce a planar plasma. So thick gas distribution plates that resemble water showerheads were developed that included hundreds of small diameter gas flow passages to even out the discharge gas across a wide area.

Unfortunately, these gas distribution plates were unavoidably being exposed indirectly to the same processes the silicon wafers were, and so the gas distribution plates were slowly being ruined by residual etchants and deposits. Wet-washing works well for the other affected parts inside the processing chambers, but wet-washing cannot get inside the gas flow passages because they are too narrow, e.g., on the order of one millimeter.

Gas distribution plates are made from at least two alternative materials, silicon ingot and aluminum billet. Each has a particular application. Applied Materials makes aluminum showerheads for PECVD deposition processes, and these degrade with all the gas flow passages on a grid pattern being more or less equally contaminated with $AlF_3$. Tokyo Electron Ltd (TEL) makes silicon showerheads that are used in etching processes, these degrade because plasma ions bombard the process face and sputter material onto the outer edges. This degradation is not uniform, the worst damage concentrates around the outer periphery. Refurbishing involves reconstruction, in silicon, of the lost pieces of the inside walls of the gas flow passages around the periphery. These gas flow passages are set in radial patterns.

Both aluminum and silicon gas distribution plates are very expensive to replace, so refurbishing them makes good economic sense.

These large gas distribution plates have gas flow holes that pierce completely through. These high aspect through-holes are relatively small in diameter, compared to thickness of the gas distribution plate itself, for example a 0.062" diameter hole through a 1.2" thick plate. Maintaining the original hole geometry of all the gas flow passages is very important.

During various PE-CVD processes involving aluminum showerheads, these holes can get eroded and clogged. Most of the volatile by-products typically produced during reactions get pumped out from the chamber through an exhaust system. But enough residue remains on the surface of the gas distribution plate and inside the gas flow passages to eventually cause trouble. Eventually the entire gas distribution plate has to be scrapped, not repaired, because there has been no conventional way to restore them.

The cost of materials and manufacturing of gas distribution plate is substantial. So it would be advantageous to increase the lifetime of gas distribution plates by protecting them from plasma chemical corrosion with special coatings. But a means has yet to have been develop where gas distribution plates can be efficiently and cost effectively refurbished. Moreover, as the size of the next generation gas distribution plates is increasing to accommodate next generation processing wafers in excess of 1.2 square meters, a solution becomes increasingly important.

What has been holding everyone back is a well-known Debye self-shielding effect that ordinarily blocks plasma beam penetration of millimeter scale passages, grids, and holes. Plasmas thus have a characteristic length, known as a Debye Length, which can be represented by, $L$ (cm)=743($Te/ne$)exp(0.5)

where Te is the electron temperature in eV, and ne is the electron density in electrons/cm$^3$.

Typical high-density atmospheric pressure ICP plasmas have a density of 10 exp(14)/cm$^3$. High density supersonic plasma beams have a relatively low electron temperature of around 0.04 eV. Therefore the Debye Length for these can be computed to be around five millimeters. Well short of 1.2" needed to pass through a typical gas distribution plate.

Through-holes that are shorter than the Debye self-shielding length will cause an electron congestion that impedes plasma beams from completely penetrating intact. The Debye blocking forms from a negative sheath layer that appears inside the gas flow passages and is continually charged by charged particles stripping off the plasma beams trying to penetrate. Conventional wisdom has been just to accept this limit as a given and work some other approach.

Plasma-based refurbishment systems and tools are needed more than ever that can effectively clean and restore both silicon and aluminum types of gas distribution plates to service. In spite of the Debye blocking.

SUMMARY

Briefly, an aluminum gas distribution plate refurbishment system embodiment of the present invention combines a multi-beam inductively coupled plasma (ICP) torch and vacuum discharge chuck. Plasma beams are employed to clean and restore to service the many gas flow passages in aluminum gas distribution plates. Several parallel supersonic plasma beams of uniform density are produced from a single upper and lower AP-ICP plasma reactor arranged in totem pole that are driven by two pairs of opposing spiral planar RF induction RF antennas. These plasma beams are focused inside the gas flow passages to etch, heat, and deposit nanoparticles within. The vacuum discharge chuck includes a capacitively coupled plasma (CCP) reactor to generate a positive species discharge immediately beneath the gas distribution plates. This counteracts a congestive effect of Debye sheathing, which is an electron-fed negative space charge blocking. The CCP plasma reaches in to diminish the impediment to the intact penetration of the plasma beams through the gas flow passages.

Figure 1:
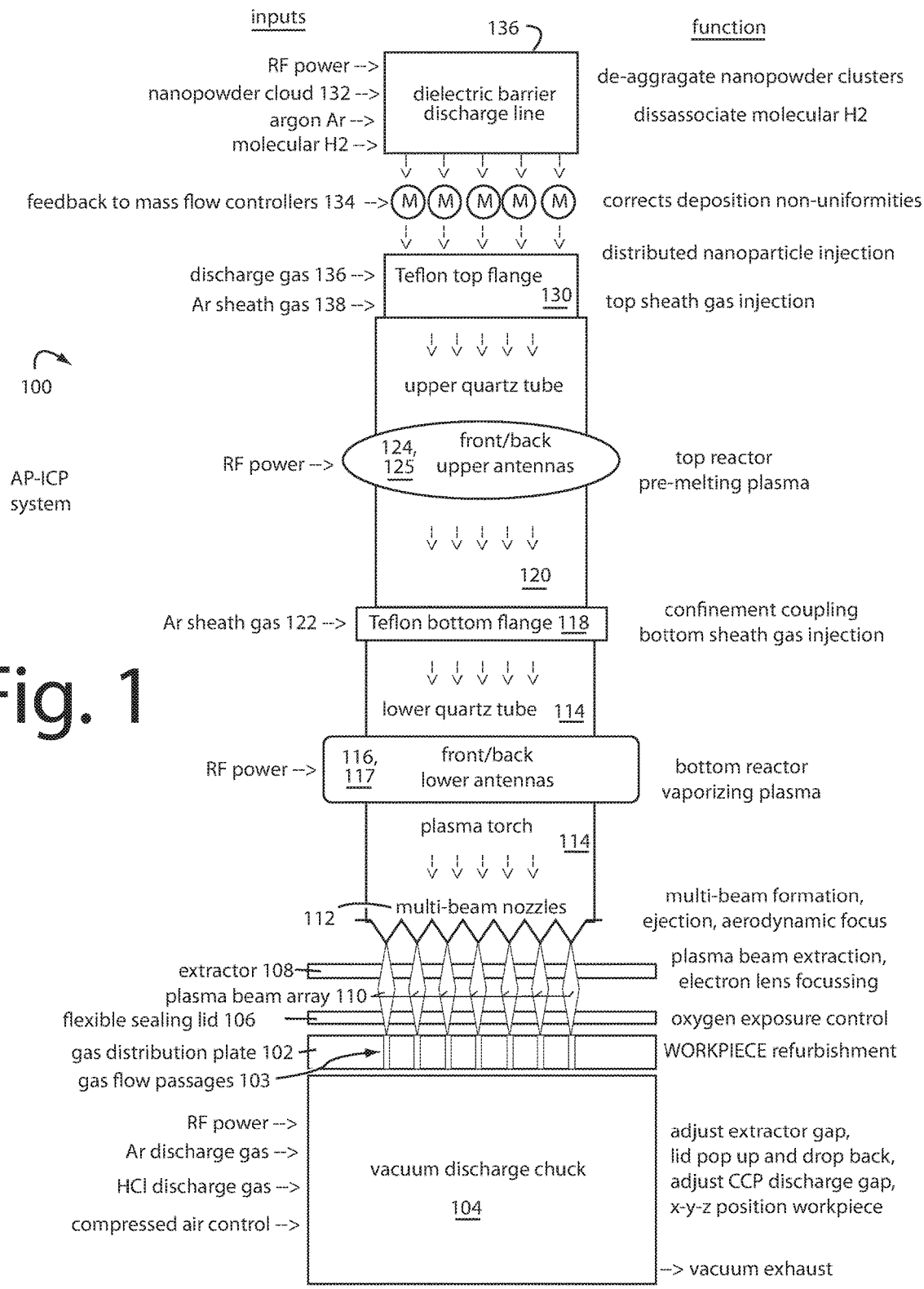
FIG. 1 is a schematic diagram of a linear, multi-beam atmospheric pressure, inductively coupled plasma (AP-ICP)
Figure 2A:
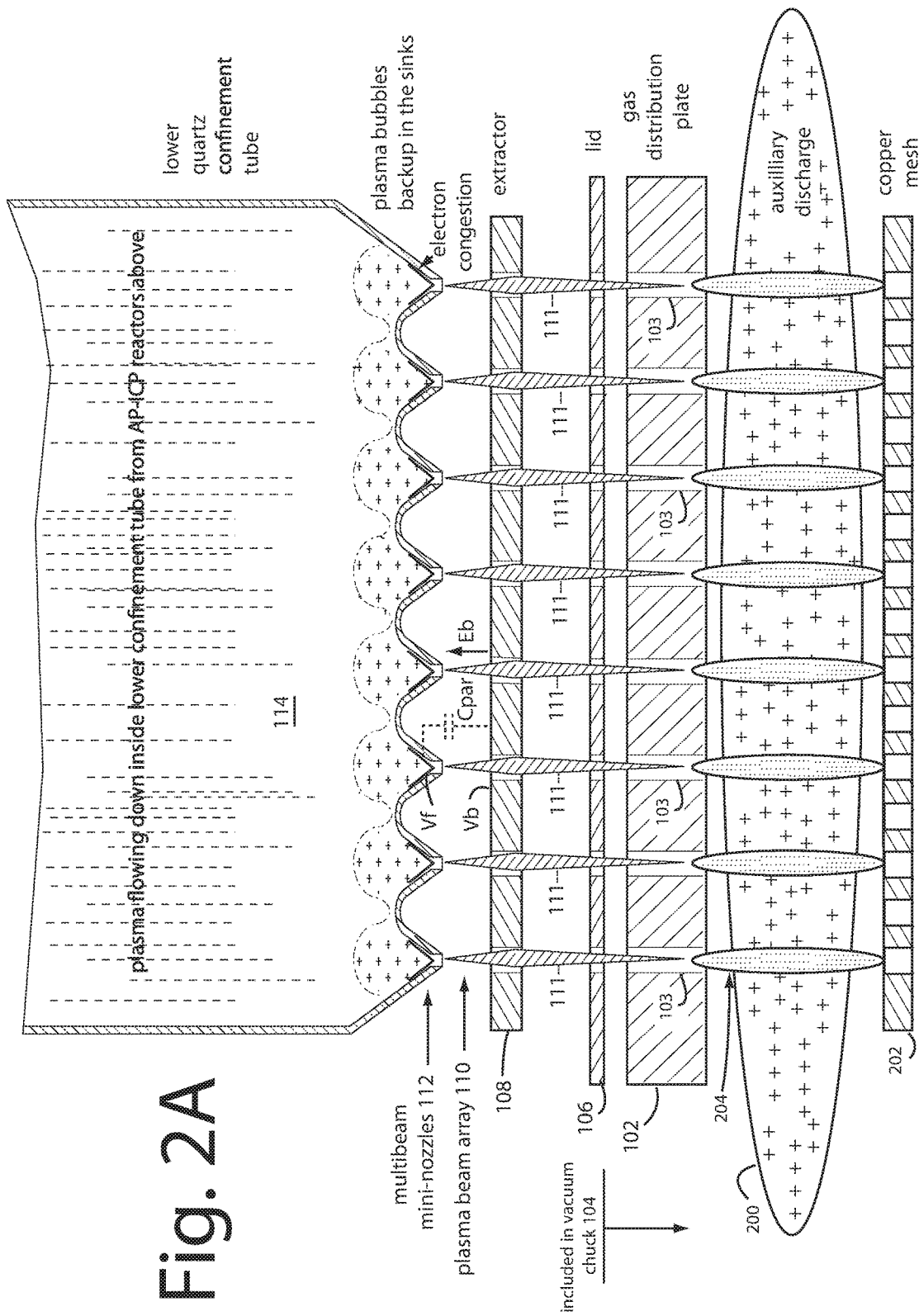
Figure 2B:
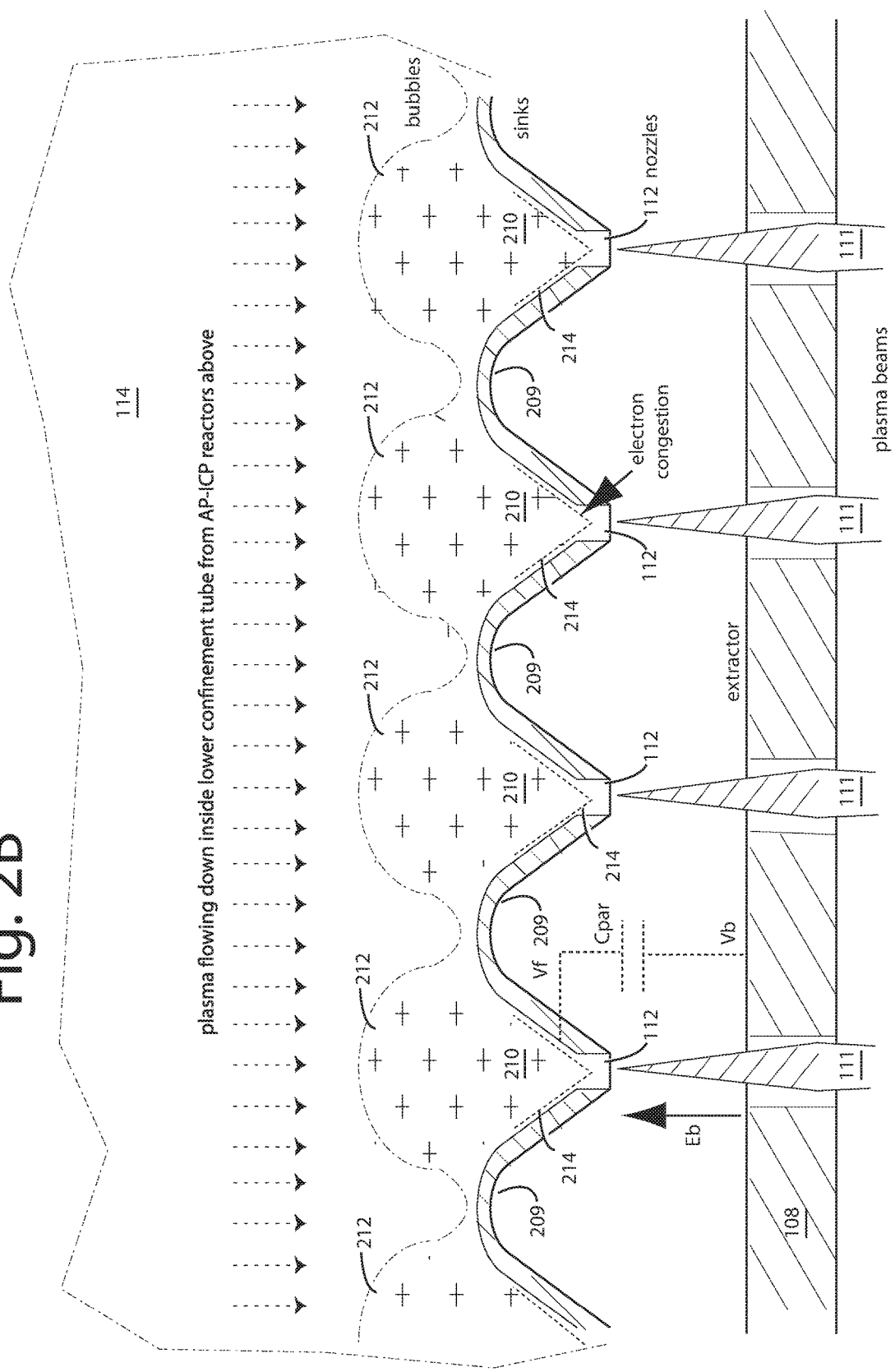
Figure 2D:
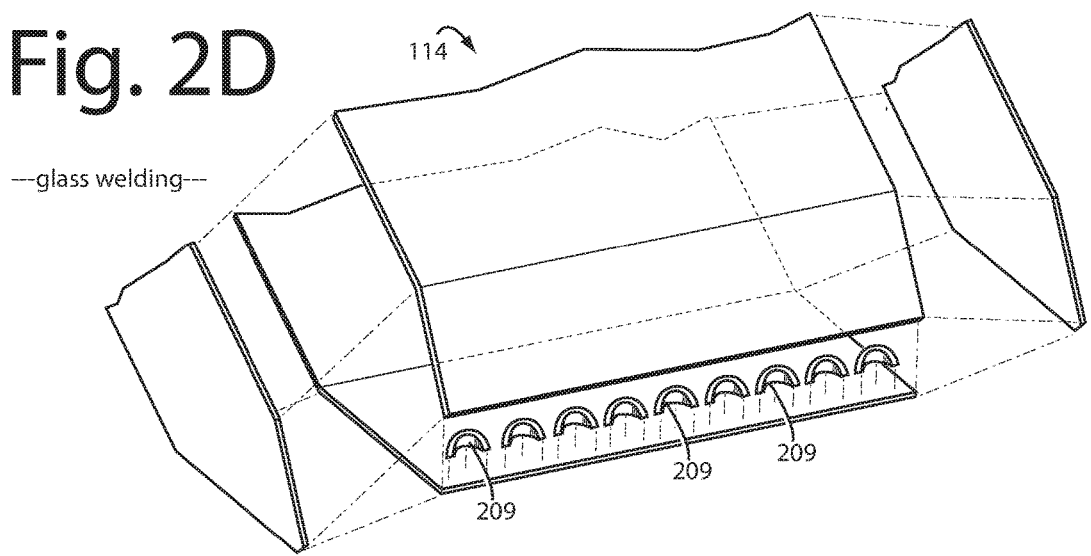
Figure 2E:
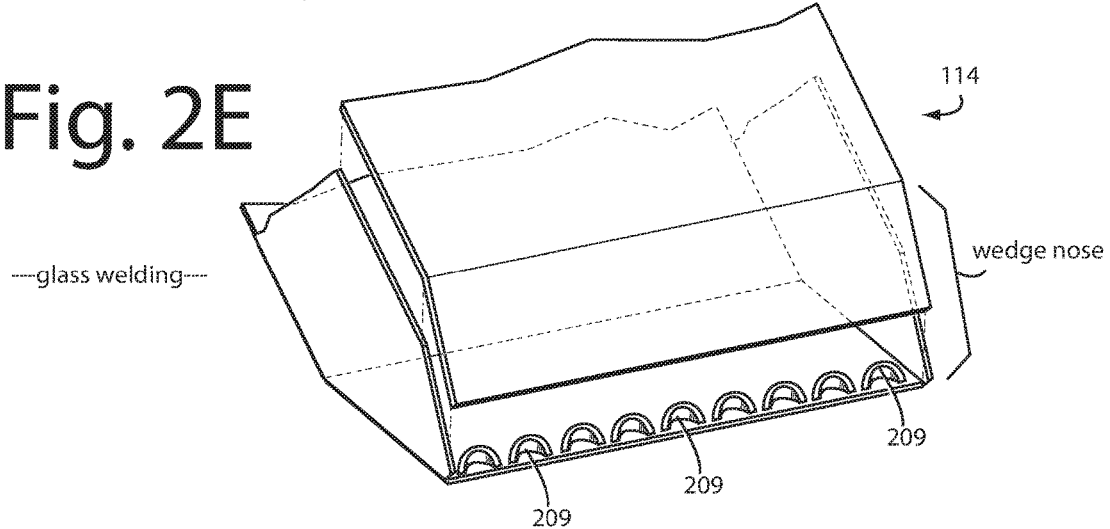
Figure 2F:
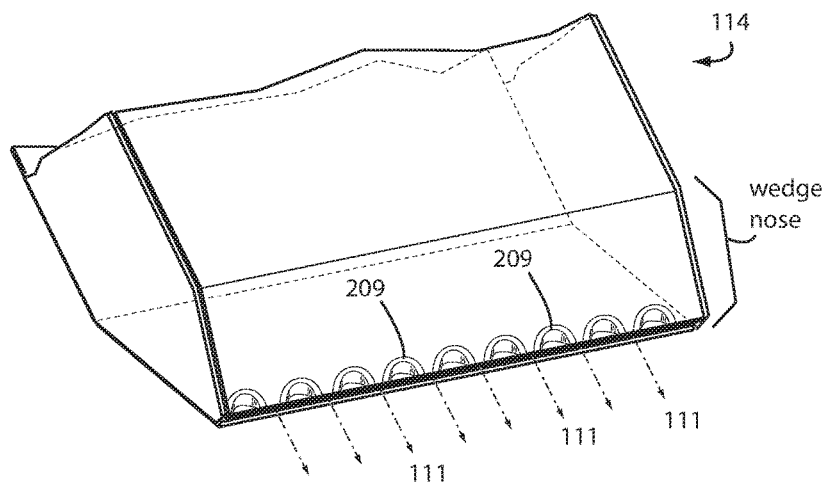
Figure 3A:
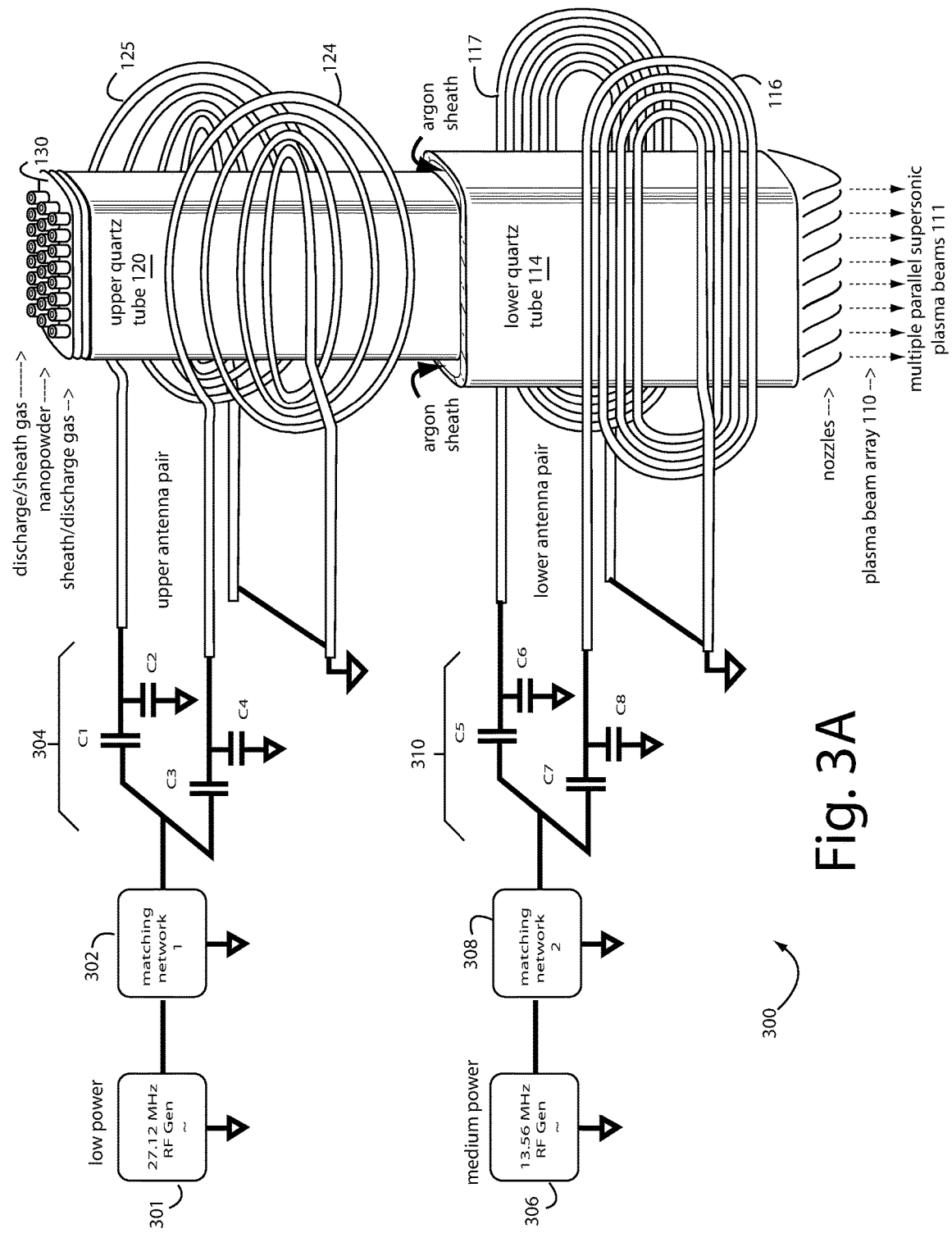
Figure 3B:
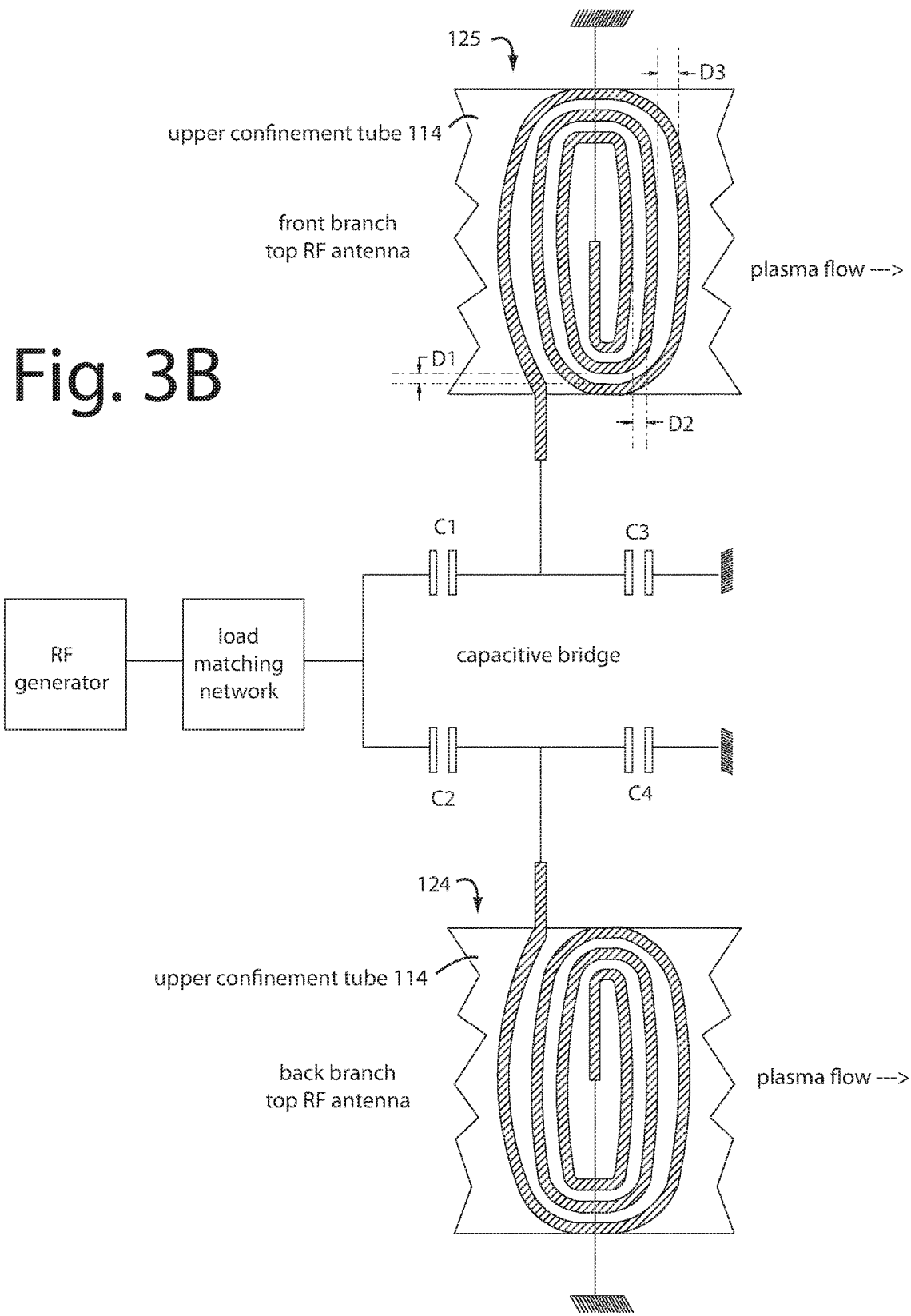
Figure 7:
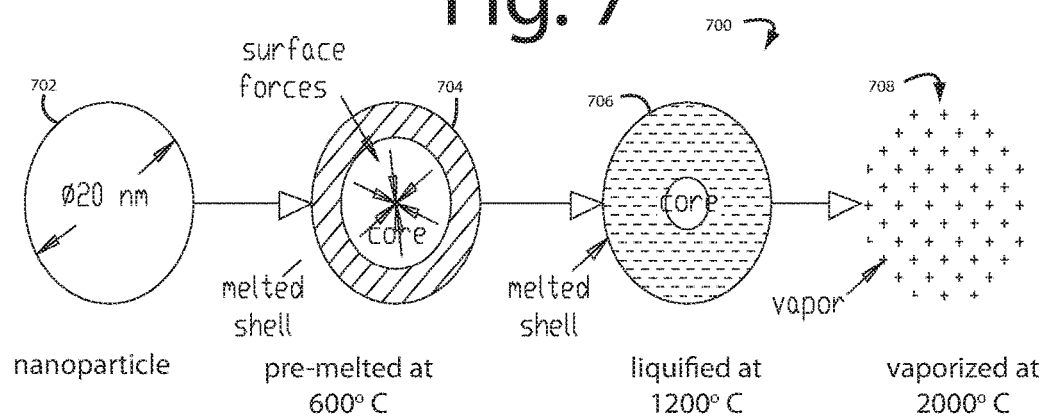
Figure 12:
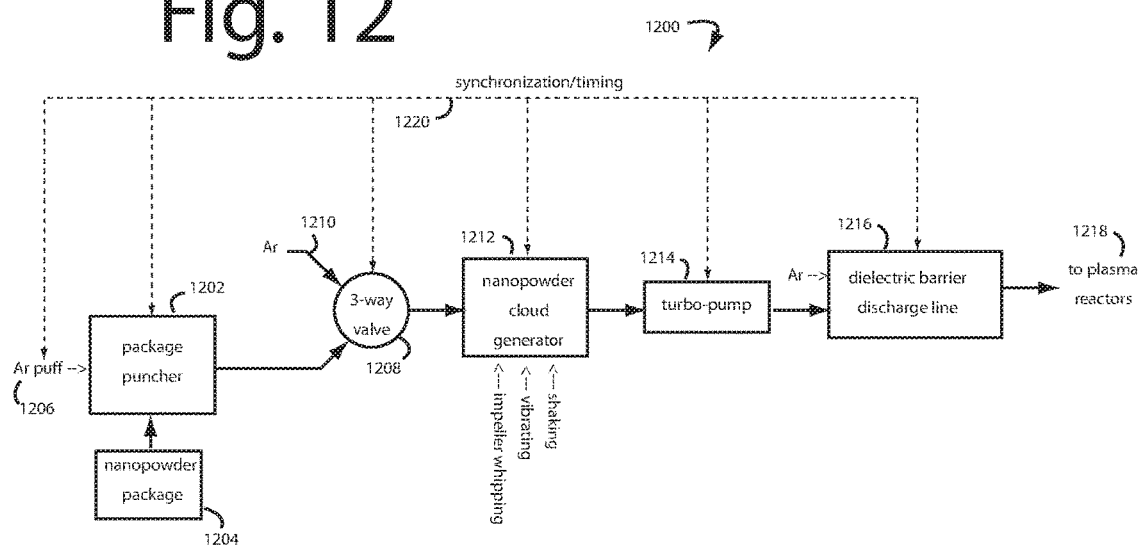
Figure 9A:
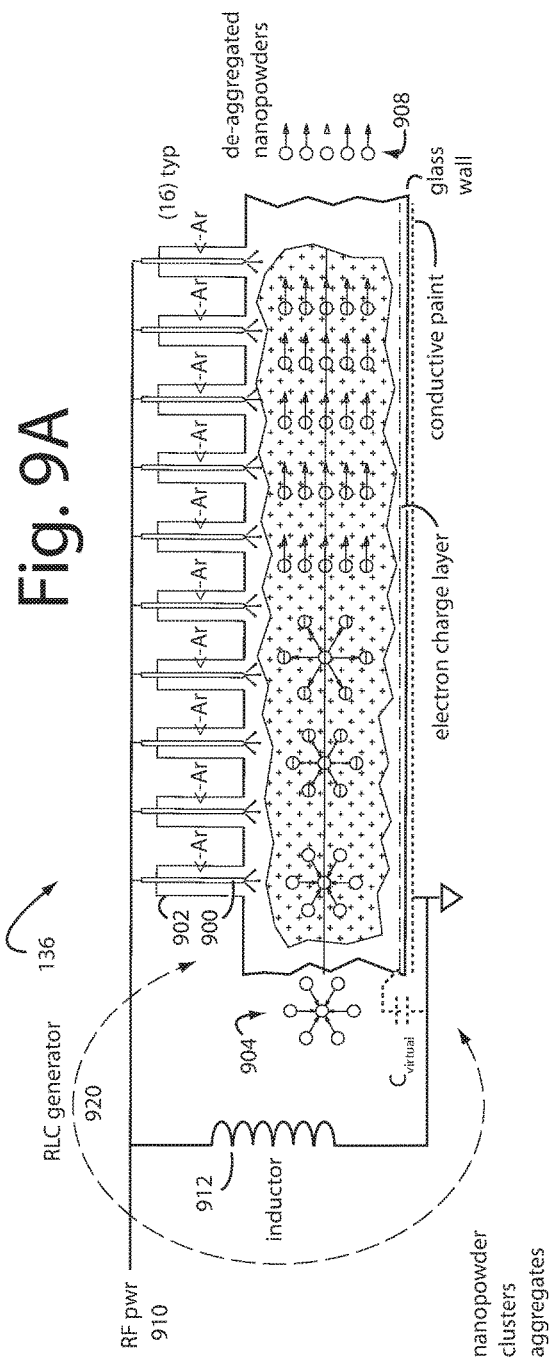
Figure 9B:
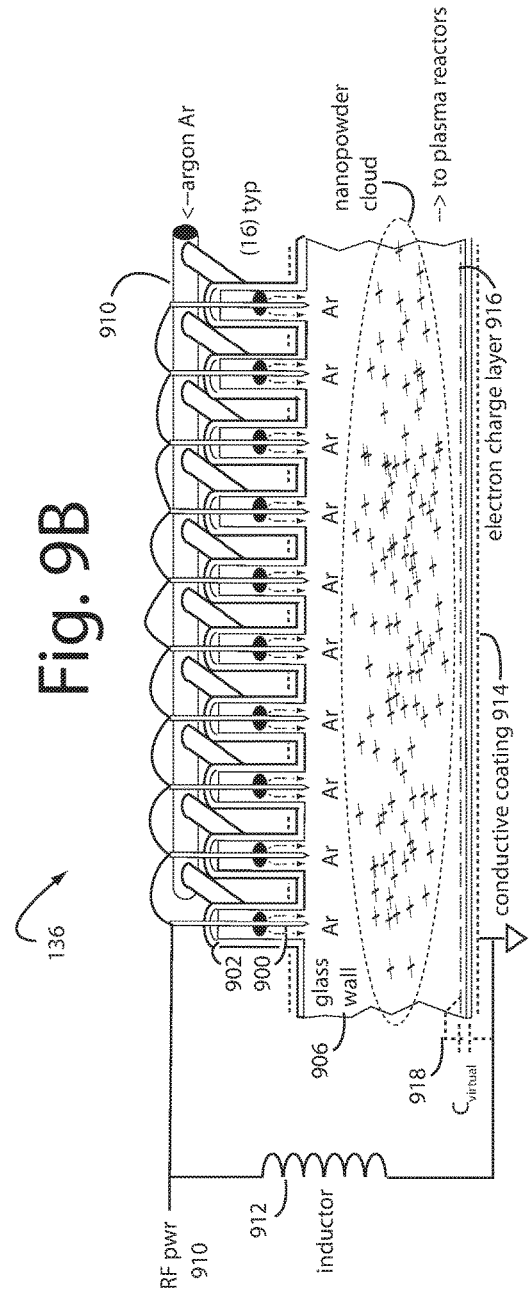
Figure 10:
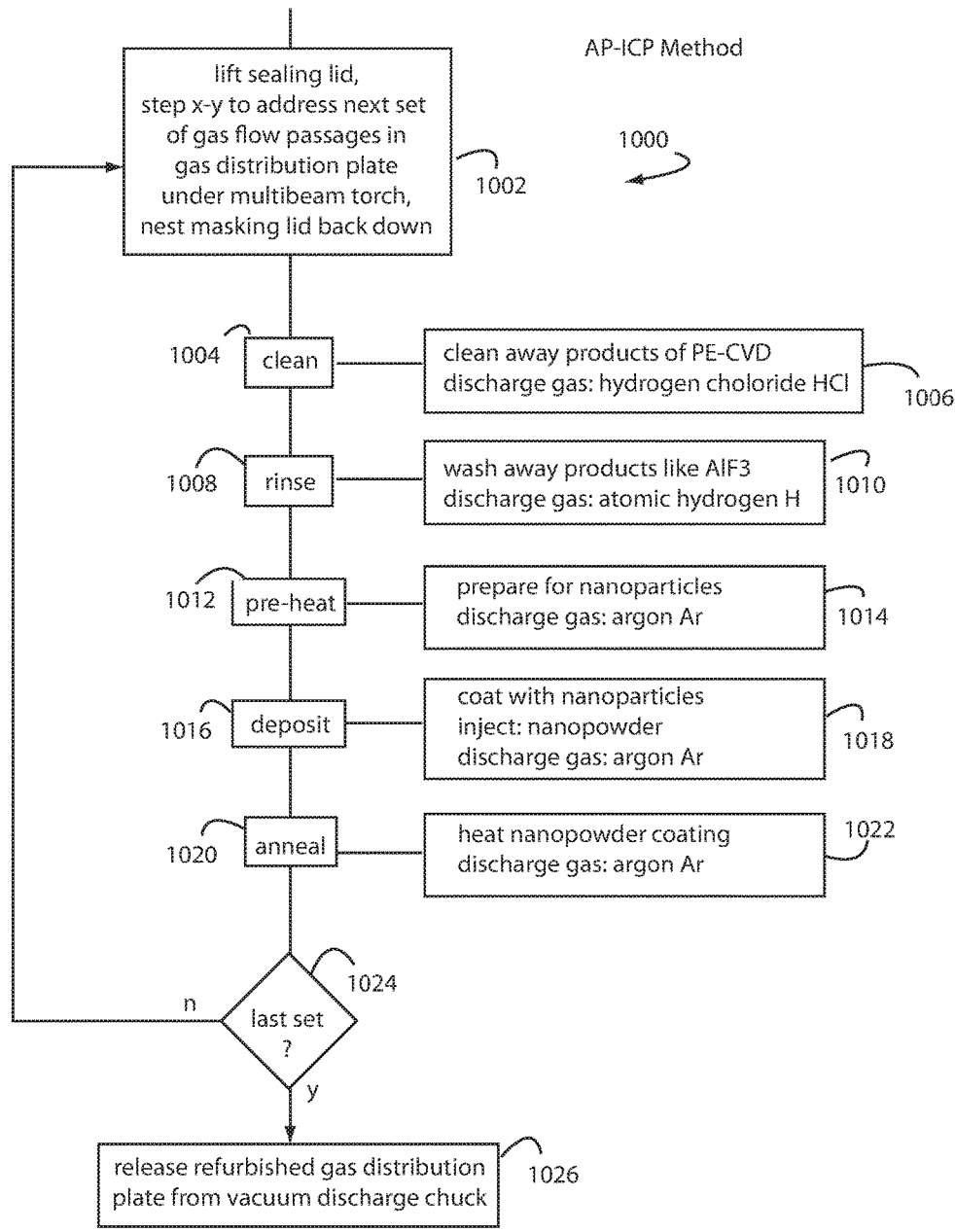
Figure 14:
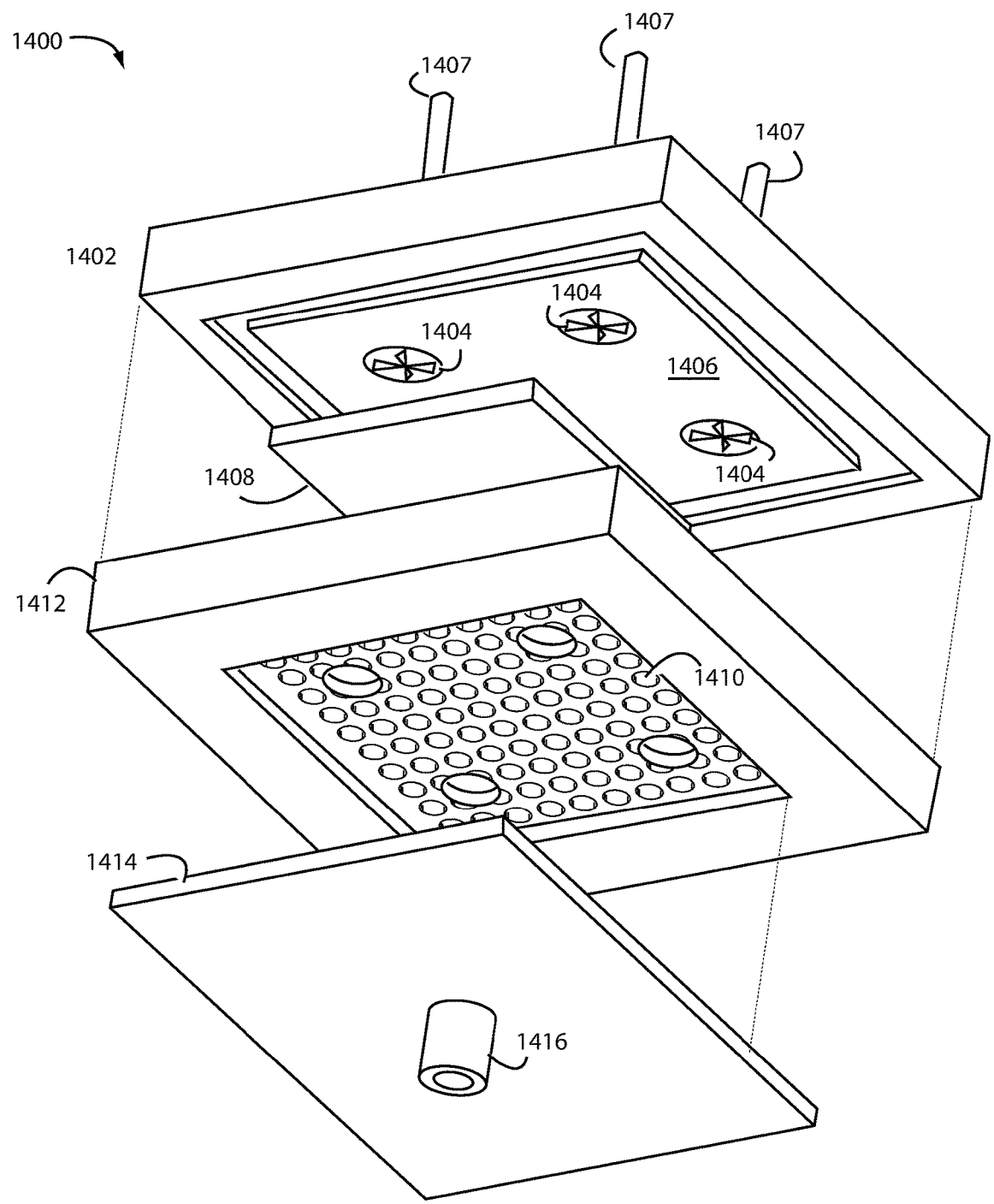
Figure 15A:
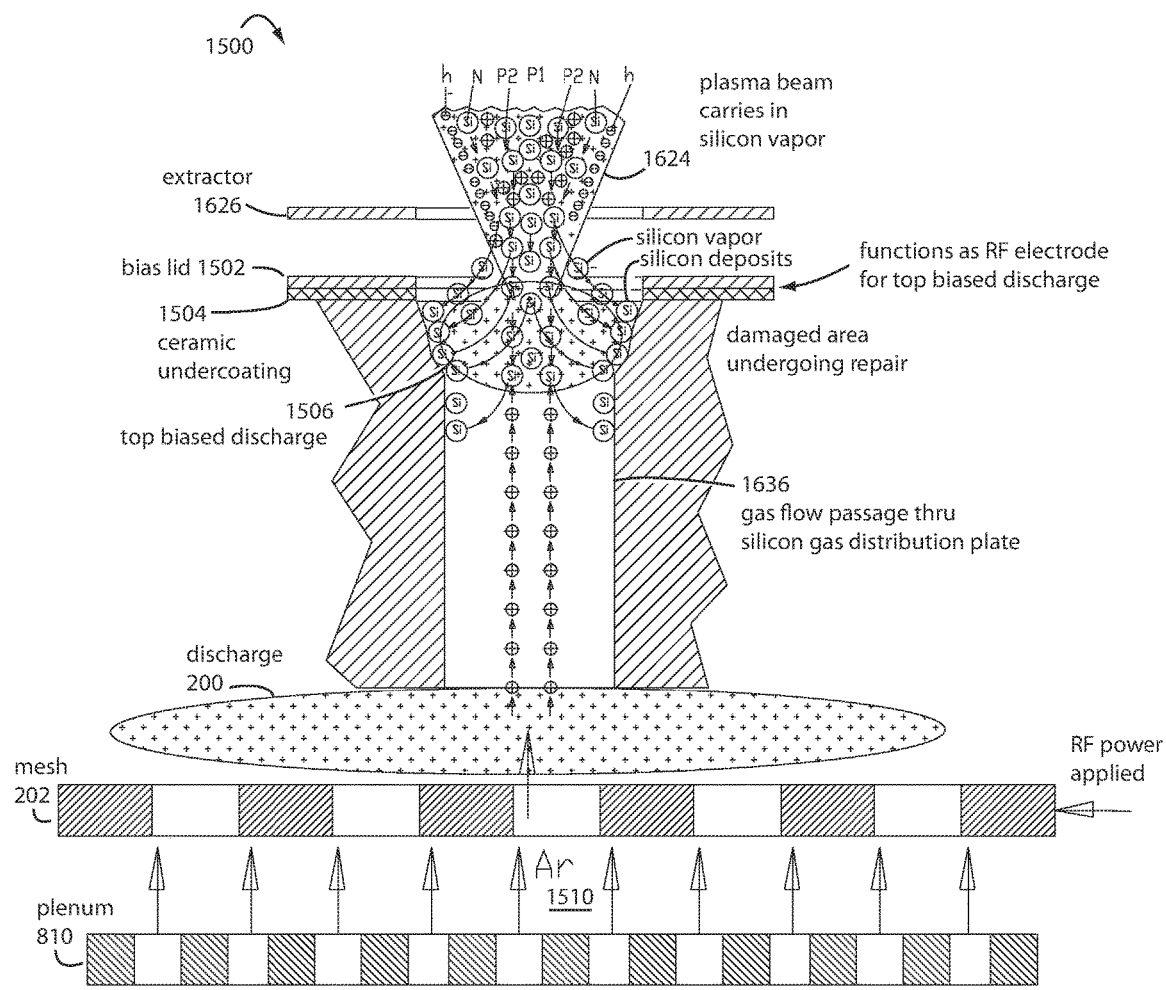
Figure 15B:
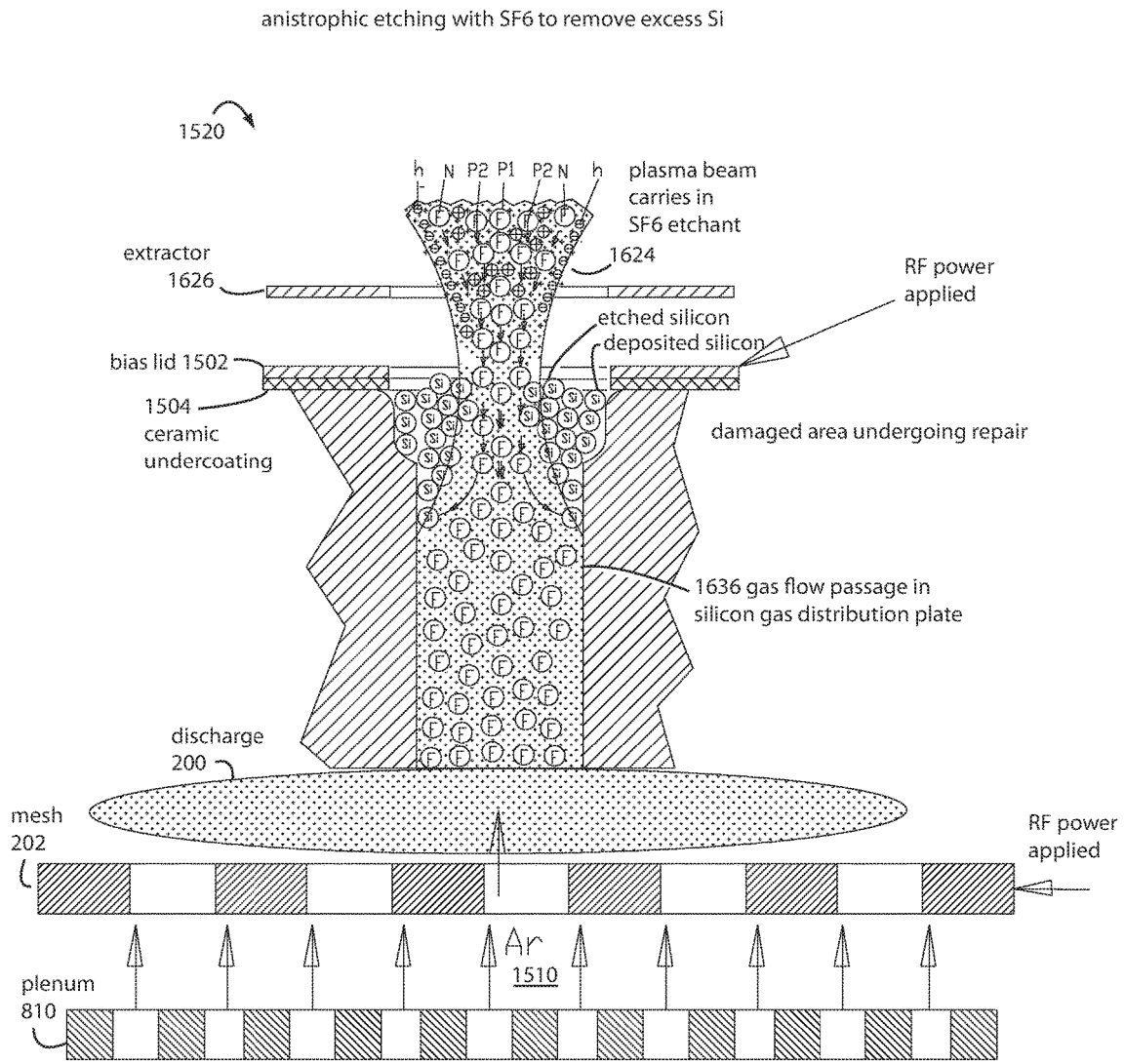
Figure 15C:
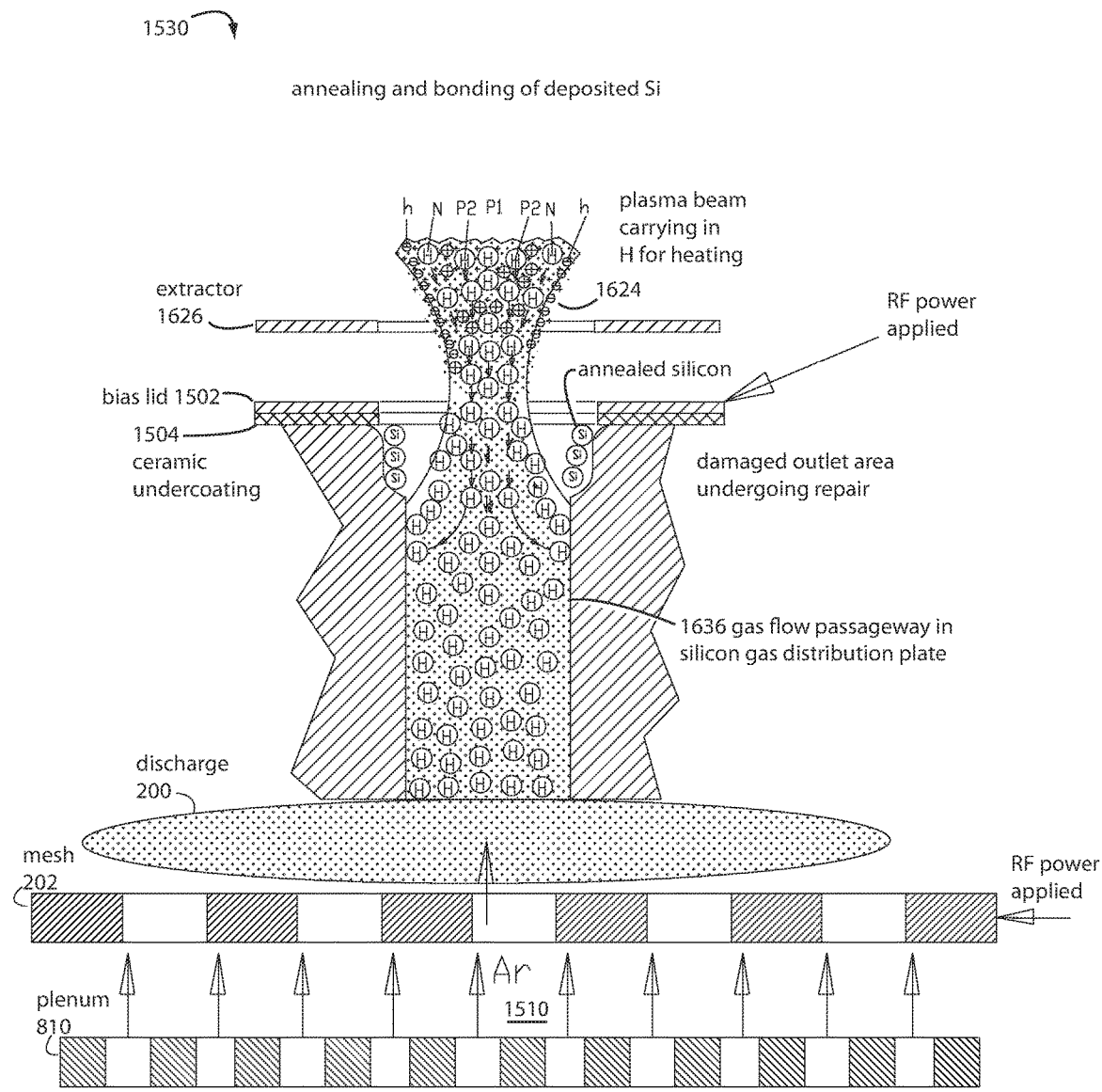
Figure 15D:
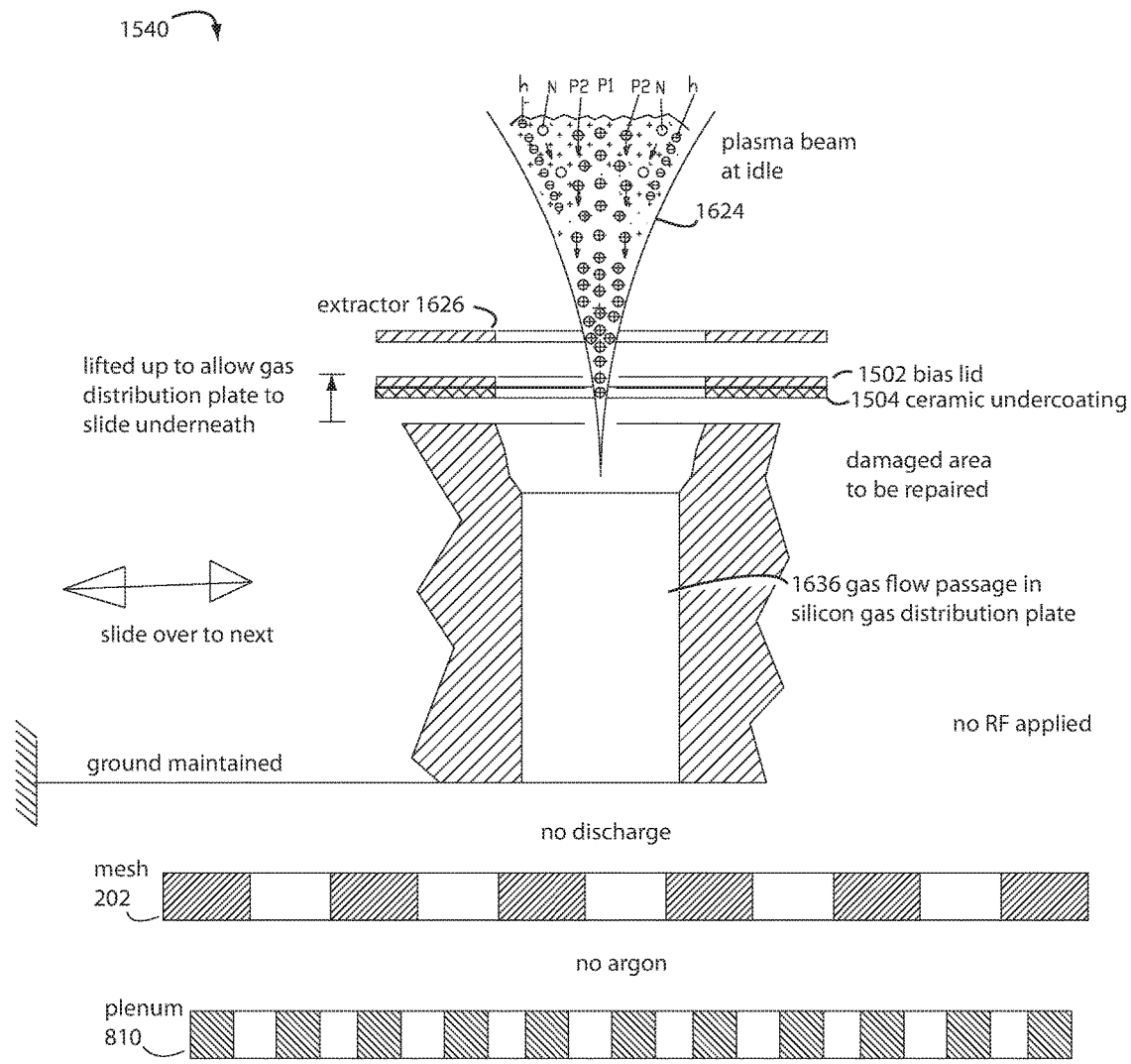
Figure 15E:
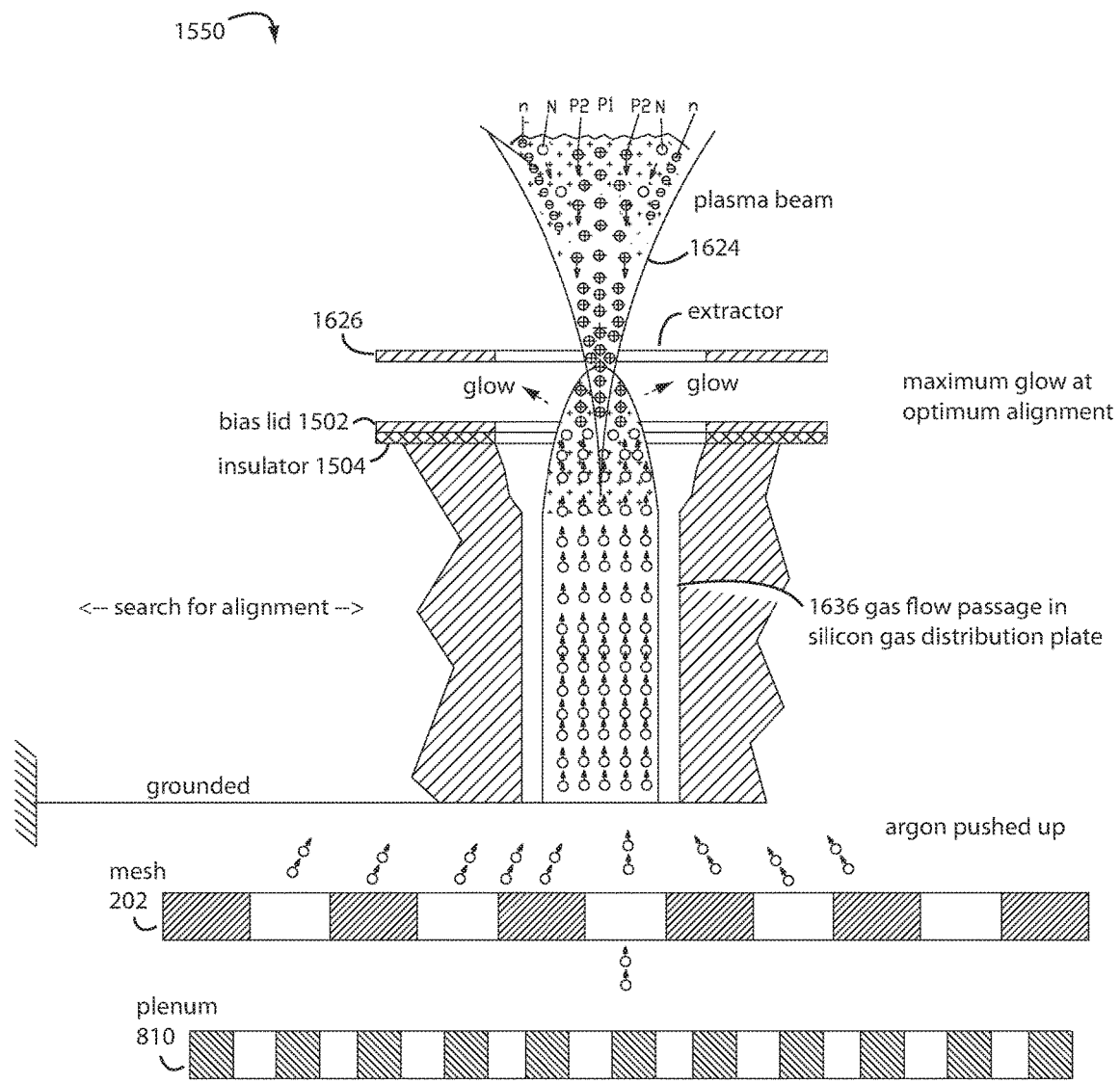
Figure 16:
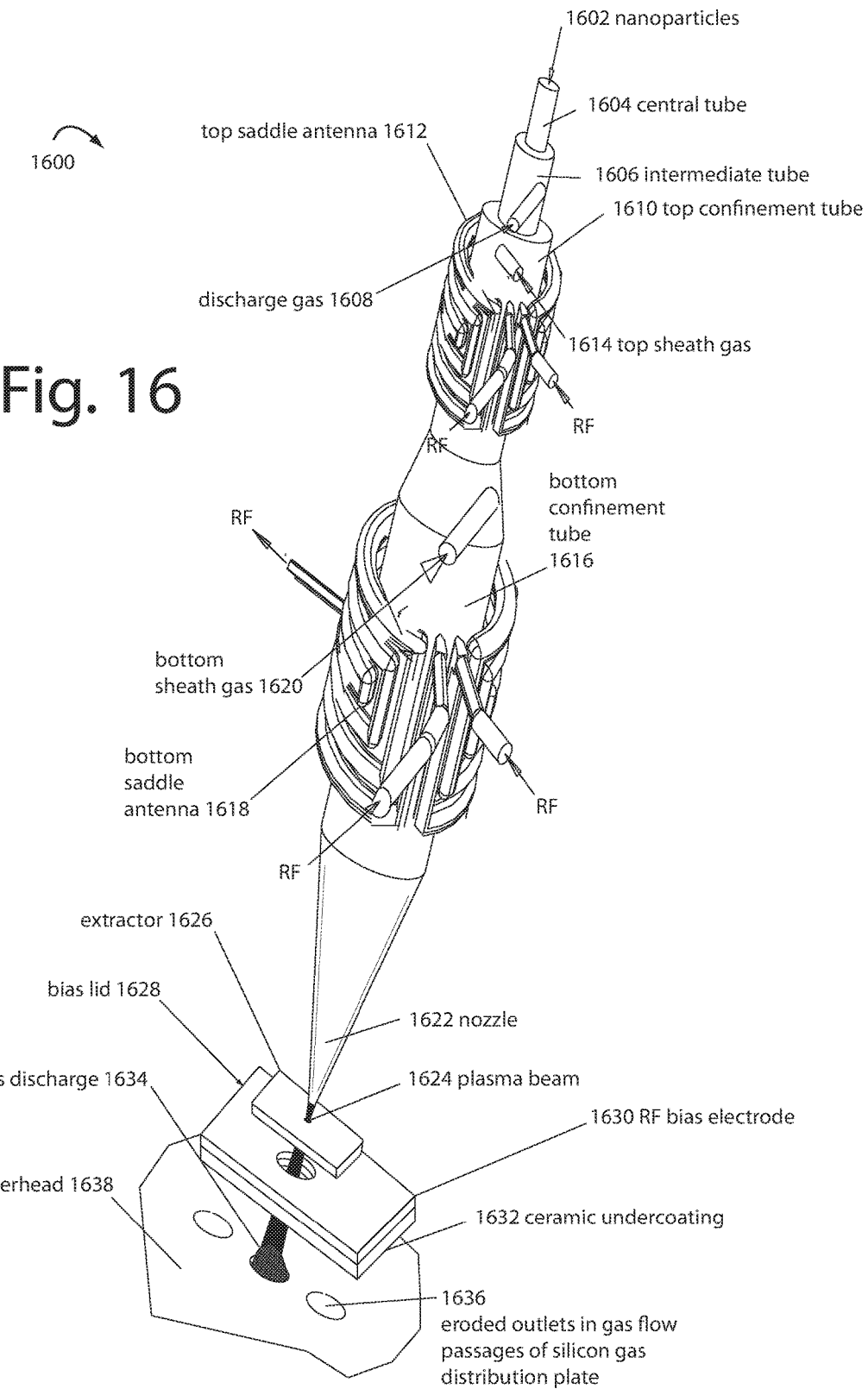
Figure 17:
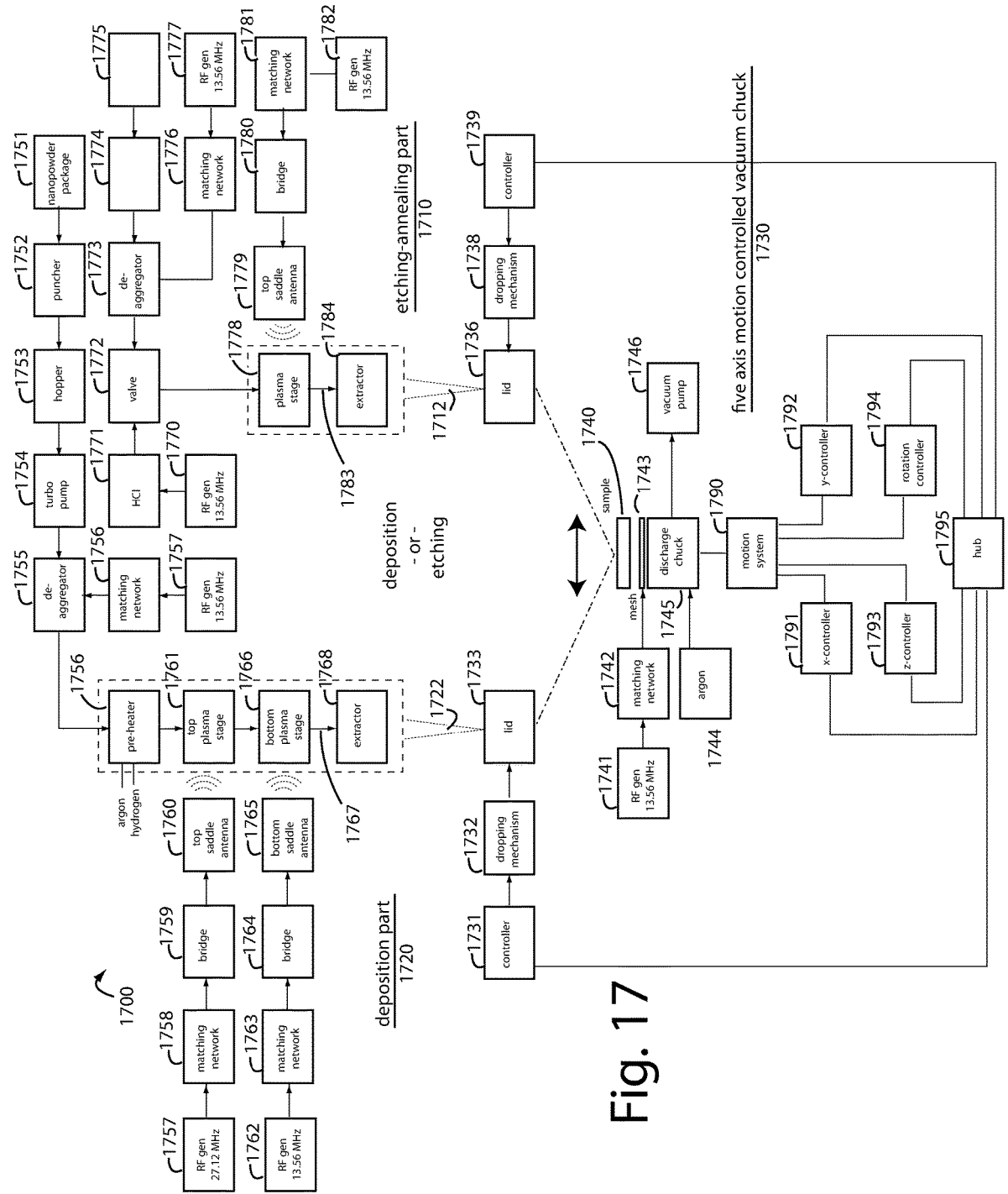

torch and vacuum discharge chuck embodiment of the present invention that simultaneously ejects several plasma beams in parallel in a single row to clean and restore aluminum billet gas distribution plates to service;

FIGS. 2A, 2B, and 2C are cross-sectional front view diagrams of the wedged nose area involving eight-nozzles in AP-ICP torch of FIG. 1. Eight plasma beams are produced in a 1×8 linear array. Electronic focusing is implemented with an extractor. Gas sealing is provided by lid. A CCP auxiliary CCP discharge is generated inside the vacuum discharge chuck. A parasitic capacitance $C_{par}$ is symbolized here with floating voltage $V_f$ appearing in an electron congestion heaped inside behind each nozzle's orifice, and the electron focusing effects of electric field $E_b$ relative to the base voltage $V_b$ on the extractor plate;

FIGS. 2D, 2E, and 2F are exploded assembly perspective view diagrams illustrating how the eight-nozzle wedged nose of the ICP torch of FIG. 1 and FIGS. 2A, 2B, and 2C could be assembled together by a glassblower and fused-welded in a practical way;

FIG. 3A is a perspective view diagram of the specialized single AP-ICP plasma torch of FIG. 1 with two opposing pairs of spiral planar RF induction RF antennas, and an eight-nozzle output for eight parallel supersonic plasma beams of uniform density in an embodiment of the present invention. The upper pair of planar RF antennas are fed a lower RF power at a different frequency and have wider spacings between windings where they cross laterally over the middle than those same windings do when gathered at their left and right edges;

FIG. 3B is a schematic diagram of the front and back branch antennas associated with the upper confinement tube of FIG. 3A and to illustrate a spacing dimension "D1" and a spacing dimension "D2" representing gaps between adjacent windings;

FIG. 4A is a cross-sectional view diagram of the single AP-ICP plasma torch of FIGS. 1-3 without showing the two opposing pairs of spiral planar RF induction RF antennas. The injection and flow of sheath gas at the top and bottom flanges joining the upper and low quartz confining tubes is best seen in this view;

FIG. 4B is a perspective view diagram of the Teflon top flange of FIG. 1 which inserts like a bottle stopper into the upper quartz confining tube of FIG. 4A;

FIG. 4C is a perspective view and exploded assembly view diagram of the single AP-ICP plasma torch of FIG. 4A with cutaways of the Teflon bottom flange and lower quartz confining tube, and further includes in view the Teflon top flange of FIG. 4B. This view of FIG. 4C provides a more realistic approximation of what is required of a glassblower in the construction of the plasma beam nozzles and flow diversion arches necessary to impart the non-turbulent flows necessary to promote uniform plasma densities in the several plasma beams;

FIG. 5 is a perspective view diagram looking from below up into the single AP-ICP plasma torch of FIG. 4C and with the lower pair of planar RF antennas. This and the view of FIG. 4C provide a more complete understanding of what is required of a glassblower in the construction of the plasma beam nozzles and flow diversion arches necessary to impart the non-turbulent flows necessary to promote uniform plasma densities in the several plasma beams. The near side of the lower quartz confining tube is normally closed, it is shown here open for purposes of illustration only;

FIGS. 6A to 6E are cross-sectional diagrams that represent the various stages of a Debye Layer build up in a gas flow passage and how the positive species auxiliary plasma from a CCP reactor underneath can suck out the fallen halo electrons to reestablish a plasma carrier;

FIG. 7 is a schematic diagram of a twenty nanometer diameter nanoparticle being pre-melted at 600° C., liquefied at 1200° C., and finally vaporized at 2000° C., as occurs in the top and then the bottom plasma reactors;

FIG. 8 is a cross-sectional view diagram of the vacuum discharge chuck of FIG. 1 and shows a gas distribution plate installed for refurbishment. "D" is the z-axis distance from the extractor necessary to put the gas distribution plate in the focal plane of the plasma beams, and "d" is the z-axis gap between the gas distribution plate and the copper mesh necessary to establish and maintain the auxiliary CCP discharge without electrical arcing;

FIG. 9A is a schematic view diagram of dielectric barrier discharge line of FIG. 1 with a representative inflow of incoming nanopowder clusters on the left and a de-aggregated outflow of these nanopowders on the right. The same dielectric barrier discharge line is also used to disassociate molecular hydrogen gas ($H_2$) into atomic hydrogen gas (H) for its use as a discharge gas in the single AP-ICP plasma torch of FIGS. 1, 2, 3, 4A, and 4C;

FIG. 9B is a cutaway perspective view diagram of the dielectric barrier discharge line of FIGS. 1 and 9A with the addition of an argon supply to keep nanopowder from depositing on the sixteen needles;

FIG. 10 is a flowchart diagram of a method of refurbishing aluminum gas flow distribution plates with the equipment illustrated in the preceding Figs.;

FIG. 11 is a simplified perspective view diagram of the vacuum discharge chuck of FIG. 8 which has turned and x-y positioned the gas flow distribution plate in its top to be properly addressed by the linear array of plasma beams produced by the single AP-ICP plasma torch. Several other pieces, like the sealing lid 106, are omitted from this illustration to better show such addressing of the gas flow passages;

FIG. 12 is a schematic diagram of the nanopowder input processing from a nanopowder package, a punchers, a three-way valve, a cloud generator, a turbo-pump, and finally delivery in a nanopowder cloud to the dielectric barrier discharge line of FIGS. 9A and 9B for de-aggregation of clusters;

FIGS. 13A-13C perspective view diagrams in cutaway of the nanopowder cloud generator of FIG. 12. FIG. 13C shows the nanopowder cloud generator in a "normal" vertically standing orientation in which the impeller shaft is at the top and a nanopowder well is down at the bottom. A rocker-shaker, heater, and vibrator (not shown) tilt the bottom up in a rocking motion, while vibrating and heating to keep nanoparticles from clumping or sticking on the inside surfaces;

FIG. 14 is an exploded assembly view in perspective of a nanopowder package puncher as first mentioned in FIG. 12;

FIGS. 15A-15E illustrate the use of a modified Bosch Process to repair the outlets of gas flow passages in silicon gas distribution plates. The conventional Bosch Process applies a passivation layer in repeated steps interdigitated with anisotropic etching steps. Embodiments of the present invention deposit silicon from vapors instead of the passivation layer;

FIGS. 15A-15C are cross sectional view diagrams of a three-step cycle of silicon deposition, anisotropic etching, and annealing/bonding;

FIG. 15D is cross sectional view diagram show how a sliding movement of the gas distribution plate is accommodated to treat a next gas flow passage;

FIG. 15E is a cross sectional view diagram showing how an argon glow at the outlets of gas flow passages in silicon gas distribution plates under the plasma beam can be used as a visual indicator of proper alignment;

FIG. 16 is a perspective view diagram of a focused plasma system embodiment of the present invention that generates a single plasma beam for refurbishment of silicon gas distribution plates; and FIG. 17 is a functional block diagram of a two-part AP-ICP showerhead refurbishment system with a deposition part, and an etching-annealing part, that share a program controlled five axis motion system.

DETAILED DESCRIPTION OF THE EMBODIMENTS

Embodiments of the present invention overcome a phenomenon in which focused plasma beams fail to fully penetrate millimeter wide through-holes, like the holes plasma torch nozzles, and the gas flow passages in gas distribution plates. The phenomenon occurring in these small geometries is generally known as the Debye Sheathing Layer and the Debye Length is depth in which the congestion develops. Small millimeter wide passages will cause an electron congestion to accumulate from electrons that strip off the plasma beams and stick inside the walls. The electron loses destabilize the equilibrium the focused plasma beams once had, and positive ions fall out as well. Only the neutrals get through past the congestion. The plasma beam is thereby rendered incapable of transporting etchants or nanopowders deep inside the full passage length.

The present inventors discovered a way to breach the so-called Debye limitation by generating an auxiliary capacitively coupled plasma discharge in the immediate vicinity of the gas flow passage exits. The positive plasma species ionizes the neutral particles in the supersonic plasma beams that did not interact with the Debye layer. As a result, these reach the gas flow passage exits. The ions from the positive plasma species are attracted by the negative Debye sheath charge on the gas flow passage walls and penetrate from the backside, opposite to the beam direction. Such quench the Debye charge.

The plasma beam's potential equilibrium is restored, and the way is clear to proceed with refurbishment treatment processes.

Embodiments of the present invention overcome these challenges and more with a two-stage atmospheric pressure, inductively coupled plasma (AP-ICP) torch with a linear array of millimeter wide nozzles that eject several plasma beams in parallel.

A first instance of Debye blocking occurs inside each nozzle because their orifices are only a millimeter in diameter. The electron congestion is overcome by an extractor plate in front of each nozzle that draws out and drains the electron accumulations.

A second instance of Debye blocking occurs just inside each of the millimeter diameter gas flow passages in a gas distribution plate. This instance of congestion is overcome by situating an auxiliary CCP discharge plasma at the exits of the gas flow passages, beneath the gas distribution plates. A positive plasma species is generated by a CCP discharge in argon gas just above a copper mesh.

Both of our solutions work because they draw electrons out of the holes from the exit sides and relieve the congestion so the plasma beams can proceed unimpeded to do their work.

FIG. 1 represents a top-level overview of a multi-beam atmospheric pressure, inductively coupled plasma (AP-ICP) torch and vacuum discharge chuck system 100. Further details of each part follow in the illustrations that follow FIG. 1.

System 100 is capable of etching, cleaning, rinsing, heating, coating, and annealing the insides of several hundred gas flow passages constituent to an aluminum gas distribution plate (GDP) workpiece 102. As such, system 100 is capable of refurbishing and returning GDP's to useful service in various kinds of semiconductor processing equipment.

Here, GDP workpieces 102 are made from aluminum billet as is typical of Applied Materials (Santa Clara, Calif.). In the case of aluminum billet, worn GDP workpieces 102 will be usually contaminated with $AlF_3$ films. Hydrogen based plasmas are known, and used herein, to to clean away $AlF_3$ films on aluminum gas distribution plates. The linear system 100 of FIG. 1 is used for these because several plasma beams are simultaneously employed.

In the case of silicon gas distribution plate, the degradation will have been caused from exposure to processing etchants to only a few outlets concentrated around the periphery on the process face. A single focused plasma beam 1600 is used in this application, as illustrated in FIG. 16, and a Modified Bosch Process is employed to rebuild the silicon lost to process etchants. The Modified Bosch Process presented step-by-step in FIGS. 15A-15E.

The GDP workpieces 102 are held in position by a vacuum discharge chuck 104. A motion system underneath and another attached to the plasma torch get things lined up. Too much gas leakage would occur if the several hundred gas flow passages in the GDP were left exposed, so the vacuum discharge chuck 104 operates a pop-up/press down lid 106 to seal GDP workpieces 102. The vacuum discharge chuck 104 lifts on the z-axis relative to a electrode extractor plate 108 to bring the gas distribution plate workpiece 102 into the focal plane of a plasma beam array 110 and its several parallel plasma beams 111.

Each plasma beam 111 is shaped by a respective nozzle 112 that is glass-formed as a one millimeter diameter orifice in the wedged nose of a lower quartz confining tube 114. The constituent parallel plasma beams have a regular pitch between them that matches the pitch between gas flow passages in GDP workpiece 102, e.g., 5.0 mm or 10.0 mm. Each respective nozzle ejects a supersonic flow of plasma in a focused beam with an assist from the electric field effects of extractor plate 108.

A pair of spiral wound, planar RF antennas, lower RF antennas 116 and 117 are placed immediately front and back of the lower quartz confining tube 114. An air gap of about one millimeter between the glass and the RF antenna windings is preferred. When RF power is applied, a vaporizing plasma forms between in discharge gases selected and delivered under pressure from above.

A Teflon flange 118 connects an outside bottom end of an upper quartz confining tube 120 to inside the top of lower quartz confining tube 114. Teflon flange 118 injects a sheathing gas 122 under pressure all around and surrounds what feeds down into the lower quartz confining tube 114 from above. Such sheathing gas keeps the hot plasma away from the quartz confining tube to prevent overheating and damage. Various experiments and prototypes suggest that the finished gap for the bottom sheath gas injected between the outside bottom of upper quartz confining tube 120 and the inside top of lower quartz confining tube 114 should be about 0.25 mm. This positioning is maintained by Teflon bottom flange 118. And the bottom sheath gas 122 is supplied under pressure to gas nipples on the left and right sides.

A pair of spiral wound, planar RF antennas, upper RF antennas 124 and 125 are placed immediately front and back of the upper quartz confining tube 120. Under power, a pre-melt plasma forms between inside that is fed discharge gases under pressure from above. The coil windings of upper RF antennas 124 and 125 are spaced further apart horizontally than they are vertically. That is, the coil windings on the left and right edges looking broadside (as in FIG. 1) are tighter together. This is intended to induce more of the RF power into the left and right edges of the plasma ball that gets induced between. The object of that is to make the several plasma beams 111 uniform in plasma density.

Our two-stage plasma generation, in the upper and lower quartz confining tubes 120 and 114, allows much lower RF powers to be applied to RF antennas 124, 125, 116, and 117. An advantage of that is no arcing between RF antenna windings, and better plasma uniformity across plasma beam array 110.

Conventional AP-ICP plasma torches eject a single plasma beam that is coaxial with a concentric AP-ICP coil wound around the outside of an open ended quartz electrode. But such an arrangement is unsuitable here because that single plasma beam would get squeezed by an annular magnetic field. Such a coil arrangement would not allow a spread of several parallel plasma beams in a wide linear array.

A Teflon top flange 130 stoppers the top end of the upper quartz confining tube 120. See also FIG. 4B. Inside the top end of the upper quartz confining tube 120 Teflon top flange 130 curves up in the middle from both sides along its bottom in an arc that matches that of the top winding of upper RF antennas 124 and 125. The two rounded arches run immediately adjacent to one another, one inside and the other outside upper quartz confining tube 120. The purpose of this is to be able to quickly and efficiently light a plasma in a discharge gas at startup.

The curvature of the top Teflon flange and the curvature of the top winding outside turn of the RF antennas should match to help develop a consistent gap between a frontal sheath gas injection layer and the high voltage potential line at the top wire. The object is to induce a simultaneous breakdown of the sheath gas layer in a wide arc. Such a discharge should be uniform in starting the AP-ICP discharge. After initiation, the AP-ICP discharge density will be proportional to the RF power distribution. E.g., high in the left-right periphery, and low in the center. This is opposite to what occurs in the bottom RF antenna because of the different way those are wound.

Three rows of nipples/injectors run across the top of Teflon top flange 130. The middle row provides for a uniform injection of nanoparticles 132 through several capillaries each modulated by a mass flow controller 134. The front and back rows of nipples/injectors are used to insert a discharge gas 136 and an upper sheath gas 138 around the plasma formed. The discharge gas fuels the plasma and the sheath gas jackets the plasma and keeps the quartz confining tube from being touched by the plasma and overheated.

Seed electrons from a high voltage source like a Tesla ignitor coil are used to initiate the top reactor's plasma. A tungsten wire from the Tesla Ignitor Coil is run inside through one of the sheath gas capillaries in the Teflon top flange 130. Under power, a sharpened end of the tungsten wire ejects seed electrons that spread in the gas flow near the top winding of RF antennas 124 and 125. This spot is subject to high high voltage potential and high electric field. Once ignited, more than enough seed electrons fall down into the bottom reactor for ignition of that plasma.

A dielectric barrier discharge line 140 uses RF power to (1) de-aggregate nanoparticles 132, and alternatively, (2) to disassociate molecular hydrogen gas (H2) into atomic hydrogen gas (H). These are two different jobs.

If fully de-aggregated, nanoparticles will melt at a much lower temperatures than the bulk materials do. Fully de-aggregated, the upper plasma reactor can do it job of pre-melting the nanoparticles much more effectively.

A typical nanoparticle 132 that system 100 would use to coat the insides of gas flow passages in gas distribution plates is Yttrium Oxide Nanopowder ($Y_2O_3$, 99.99%, 10 nm), as supplied by US Research Nanomaterials, Inc. (Houston, Tex.). The Nanopowder cloud generators and package punchers of FIGS. 13A-13C, and 14 may also be needed to introduce nanoparticles 132 in a cloud into system 100.

Pressure inside the plasma cavity is sealed by a flexible lid 106 with a single group of holes aligned with the plasma jet for exposing to the plasma beam to a single group of passages 103. Sealing lid 106 is maintained on the platform by a drop mechanism. It is only lifted for repositioning and alignment with the GDP workpiece 102.

A reverse-direction penetration by the auxiliary plasma discharge into the gas flow passages 103, through the exits, occur due to an attraction of the Debye sheath layer itself. Two-sided plasma etching (from both the entries and exits) requires an injection of HCl gas into the plasma chuck, and ionization by the CCP discharge. The Debye phenomenon is used by us to assist with uniform etching of gas flow passages 103.

FIGS. 2A, 2B, and 2C illustrate the complex structures and plasma interactions involving the formation, and flows dividing into plasma beam array 110. Eight parallel, uniform density, plasma beams 111 are represented here as being supersonically ejected from respective multibeam nozzles 112.

FIG. 2B details what happens inside and behind each multibeam nozzle 112. A plasma flowing down within lower confinement tube from the AP-ICP reactors above divides in a combing action around rounded arches 209 and congests equally inside eight sinks 210 to form eight respective plasma bubbles 212. Electrons from the plasma flowing down inside congest inside the sinks 210 around multibeam nozzles 112 into an "electron congestion" 214. A Debye Sheath effect develops here, as would be expected with a one millimeter orifice. The congestion hinders and impedes the ejection of each plasma beam 111.

The congestion caused by electrons gathering together, produces a floating charge Vf with relation to extractor plate 108. Electric fields generated by the close proximity of extractor 108 attracts electrons to drain out through nozzle 112 and permit the ejection of plasma beams 111. Such drainage is a leakage current across parasitic virtual capacitor, $C_{par}$, that varies with the RF power applied and plasma density.

The congesting plasma bubbles 212 within plasma sinks 210 helps restore a laminar plasma flow in the emission of plasma beams 111. A smooth convex surface placed across rounded arches 209 also helps to reduce turbulence.

As best seen in FIGS. 2D-2F, the bottom end of quartz confining tube 114 tapers, front and back, into a multiport nozzle wedge. The style of this is a variance of what is shown in FIGS. 2A-2C. One supplier for a prototype formed these rounded arches 209 from wedge half sections of glass tubing, and one millimeter diameter graphite rods were pressed into the molten glass to make the orifices for each nozzle.

Referring especially to FIG. 2B, the plasma flowing down inside lower confinement tube 114 from the two AP-ICP reactors above is ideally delivered here in a laminar flow of uniform density across its width. This plasma is under some pressure and its materials and energy must be divided amongst multibeam nozzles 112 with as little disturbance to the flow as possible.

A number of convex rounded arches 209 are fabricated between respective concave smooth rounded sinks 210. These evenly "drain" the divided plasma directly out through each orifice in corresponding multibeam nozzles 112.

The electron congestion 214 is a virtual electrode with a floating charge $V_f$ relative to $V_b$ at extractor plate 108. A virtual capacitor $C_{par}$ thus formed is employed to leak off the electron congestion 214 and pull plasma beams 111 from the plasma bubbles 212.

These Debye layers behind the nozzles are characterized by a floating surface potential $V_f$ (in FIG. 2A-2C) that increases with increased plasma density. The plasma beams attempting to penetrate the tiny nozzle orifices will charge the inside surfaces to a threshold value. At some threshold value of plasma density, a floating potential $V_f$, can build up enough to significantly impede the plasma flow through the one millimeter orifices. The plasma density is a function of the RF power applied to the RF antennas above and how much is consumed by the plasma discharge.

If the highly pressurized, high temperature flows of plasma beams gets stalled, its positive ions can accumulate in plasma bubbles, and squeeze out any sheathing gas coolant flows. The multibeam nozzles 112 and confinement tube 114 can then overheat, melt their quartz walls, and can even cause the linear beam system itself to explode.

Electron lensing with extractor 108 is useful to vary the focus depth of electron streams. For example, like those emitted by cathodes with a voltage potential that develops like a leaking current through a leak resistor. In other applications, making such leak resistances variable allows for adjustments in the bias potential on the electrode, and changes of the electron current density of an electron gun.

The electrode biasing phenomenon is advantageously applied here to these atmospheric plasma beams 111. Extractor plate 108 is drilled with a matching group of 1.0 mm to 1.5 mm holes. These are aligned with the multi-nozzle orifices, e.g., on a pitch of 5.0 or 10.0 mm. Each electron congestion 214 developed by the Debye layer inside each orifice becomes its own electrode. A parasitic capacitive coupling $C_{par}$ (FIG. 2B) interacts between each orifice as aligned with each hole facing it in the extractor 108.

Such virtual parasitic capacitor $C_{par}$ coupling can be used to discharge a floating voltage $V_f$ on the electron congestion and the Debye layer. Parasitic capacitor $C_{par}$ increases in value with decreases in the Z-gap between the orifices of the mini nozzles and the holes of the extractor. Electron guns have a DC leaking current, here the displacement current is AC and depends only on the impedance of parasitic capacitor $C_{par}$. Control can thus be realized by physically decreasing the Z-gap to increase $C_{par}$, for an increase in the AC displacement current, as well as increase a bias potential $V_b$, between each orifice and the edges of its corresponding extraction hole.

A bias voltage of $V_b$ can lower the floating voltage $V_f$ and, therefore, increases the improved permeability through the Debye layer. The increase can be enough to liberate the plasma beams from clotted and allow them to eject. The bias voltage further creates an electrical field $E_b$ in the center of the extraction holes, and functions here as an electron lens.

In summary, a grounded copper extractor plate 108 with holes positioned to act as lenses functions to liberate plasma beams across a gap that would otherwise be blocked inside the mini nozzles and extracts them into focused plasma beams from the orifices. Controlling the gap can be used to bring tight focus on the surface inlets of gas flow passages 103 in a gas distribution plate positioned just beneath the extractor.

Moving a discharge chuck holding the plasma distribution plate in the same Z-axis can also manipulate the focal plane. The crossovers of the plasma beams and minimal deposition spots can be provided exactly in these inlets to increase plasma beam penetration and efficiency inside gas flow passages 103.

If the bottom wires of the bottom RF antennas 116, 117 are too close to the grounded copper extractor 108, their mutual coupling can cause a electromagnetic field interaction with the extractor 108 and induce currents around the extractor holes. Such currents, if concentrated near the edges of the holes, can create their own potential $V_i$ and electric field $E_i$ that are coincident with a biasing field $E_b$ and drastically magnify the extracting and focusing properties of the extractor.

Unfortunately, such effects are not uniform. The non-uniformity causes density variations between the plasma beams at their respective inlet areas, and thus result in different rates of nanoparticle deposition. To combat this, the diameter of the extractor holes can be varied from the middle to the sides. Other tricks too can be included to produce uniform nanocoating of the inner surfaces of the gas flow passages 103 of the gas distribution plate.

An auxiliary CCP discharge plasma 200 is generated inside the vacuum discharge chuck 104, and between the GDP workpiece 102 and a copper mesh 202. This space is filled with argon as a discharge gas flowing from below and up through the copper mesh 202. Between these an RF power is applied in a capacitively coupled plasma (CCP) arrangement. Several reverse direction penetrating plasma beams 204 result that reach up and suck out electrons in Debye Layer accumulations that form inside the gas flow passages 103 103 inside the GDP workpiece 102.

The top and bottom RF antenna pairs are similar. The top RF antenna pair drives a low-power top plasma reactor responsible for pre-heating etching gases and pre-melting nanoparticles. The reactor heats and dissociates the radicals in the etching gases and vaporizes the nanoparticles.

Such RF antennas generate a transverse RF magnetic field free of an axial RF magnetic field component and related RF power losses due to axial leaking. Conventional axial RF magnetic fields would produce a magnetic lens here that would gather the charged plasma species around a single axis of the reactor into a narrow filament. The broad high temperature area needed for vaporization of the injected in plasma discharge would be overly narrowed.

The high temperature area available to vaporize the $Y_2O_3$ nanoparticles and dissociate the etching gases cannot be too narrow. Those nanoparticles that miss the high temperature area along the reactor axis would not be melted and could cloud the etching gases with dust. The dust clouds would also easily contaminate the etching and coating processes.

As seen in FIG. 16, saddle RF antennas with transverse RF magnetic fields can put all the applied RF power in a RF magnetic field normal to the reactor axis in a radial spread. Such RF antennas are able to launch and sustain plasma discharges from the periphery, not from only the center. A uniformly distributed plasma density across the reactor expands the high temperature area enough to capture and vaporize all the nanoparticles.

Each RF antenna pair is mirrored in front and back pairs with an equal number of the turns that envelope the outer wall of the reactor. The resulting magnetic fields pierce each cylindrical layer of the gas volume in the plasma reactor and induce plasma discharges.

Connecting RF antenna pairs in parallel reduces the overall impedance of the load. The required RF power is reduced and as is the cost of the RF power components. The RF power that is applied through the inductive coupling to the RF antenna on each side is enough to sustain and heat the plasma discharge in between.

At some level of RF power, the plasma discharge can be pressed into a plasma ball. The top RF antennas are are operated at 27.12 MHz and at an RF power of about 2.5 kW. Five winding turns for each pair were found to be optimal for a reactor diameter of about twenty millimeters. This level of RF power and RF antenna winding geometry allows a RF plasma ball to be obtained with diameter around sixteen millimeters. The power transferred to plasma can increase the plasma density (ne) up to about 10e19 cm$^3$ and can reach a maximum temperature (Te) of about 7,000-10,000° K.

A conventional impedance matching network from Comdel (Gloucester, Mass.) is used to couple respective RF generators to each RF antenna pair. An over-pressure in the high temperature plasma ball pushes out a high temperature supersonic torch downstream. Such torch serves as a carrier for the nanoparticle vapors.

FIGS. 2D-2F suggest a way that the wedged nose and nozzles of FIGS. 2A-2C could be constructed. E.g., of quartz glass parts that are fused or otherwise welded together by a glassblower in a finished assembly. A smooth, even division of the plasma from above into eight plasma beams 111 can be had by arranging several wedge sections of glass tubing rounded arches 209 in a single row. These should also be equally spaced and evenly distributed across the width of the wedged nose. Orifices for multibeam nozzles 112 are formed by various conventional methods between adjoining rounded arches 209.

FIG. 3 represents a novel arrangement of induction antennas in an atmospheric pressure inductively coupled plasma (AP-ICP) torch 300. Such was necessitated by the need to produce an array of plasma beams 110 in which each beam 111 is uniform in density. The pair of upper RF antennas 124 and 125 are spiral wound planar types. Their wires are arranged in parallel very close to upper quartz confining tube 120. These have a characteristic wind to their coils that increasingly varies between 1-5 mm in spacing vertically between windings at the middle of the horizontal crossings, and a constant one millimeter spacing horizontally between those same windings at the left and right edges.

The purpose of this winding characteristic is to induce a plasma inside between them that spreads in uniform density between the left and right edges. This strategy can also be employed to compensate for non-uniformities elsewhere. Antennas 124 and 125 are wired in parallel to present a lowered load impedance $Z_L$ that will discourage inter-winding arcing. In furtherance of this goal, RF antennas 124 and 125 are fed a relatively low RF power by RF generator 301, matching network 302 and bridge network 302.

The pair of lower RF antennas 116 and 117 are also spiral wound planar types wires and also arranged in parallel, again very close to lower quartz confining tube 114. These have a characteristic wind to their coils with a constant 4-5 millimeter spacing horizontally and vertically between the windings. The purpose of this is to allow medium level RF powers to be applied without arcing. Antennas 116 and 117 are wired in parallel to present a lowered load impedance $Z_L$ that will discourage inter-winding arcing. Antennas 116 and 117 are fed a medium level of RF power by RF generator 306, matching network 308 and bridge network 310. RF generators 301 and 306 operate at different frequencies to reduce crosstalk and coupling between the upper and lower RF antennas.

A single pair of RF antennas could be driven by high RF power, but the resulting plasma delivered across array 110 would not be as uniform laterally as is needed, and arcing across the windings would be a problem.

FIGS. 4A, 4B, and 4C all relate to an assembly 400 of the upper quartz confining tube 120 and lower quartz confining tube 114, and how the upper quartz confining tube 120 is stoppered by Teflon top flange 130. The upper quartz confining tube 120 and lower quartz confining tube 114 are flanged together with Teflon bottom flange 118. An important job for both flanges 130 and 118 is to even the distribution and insert a downward flowing and uniform sheath gas. This sheath gas flows in a jacket tight up against the inside walls of lower quartz confining tube 114.

Teflon bottom flange 118 must also hold and maintain a 0.25 mm gap all around between the outside bottom end of upper quartz confining tube 120 and the inside top end of lower quartz confining tube 114. The sheath gas jacketing must by necessity be very thin, otherwise unwanted and damaging parasitic plasmas can develop in the sheath gas as it passes immediately in front of each of the faces of RF antennas 124, 125, 116, and 117.

The bottom sheath gas flow has three functions: a) charge neutralizing of the deposits on the inner surfaces of the bottom confining tube, b) cooling of the inner surface of the bottom confining tube, and c) fueling the bottom discharge.

The quartz confining tubes, in both the upper and lower reactors, are windows transparent to the RF magnetic field energy generated in the RF antennas. This arrangement presses the discharge plasma into a high temperature plasma torch that can melt and vaporize nanoparticles injected by capillaries attached to the Teflon top flange 130.

Nozzles 112 are set along the distal bottom edge of confining tube 114 in a converging angle of about 55°. The goal is to maintain a laminar flow in the plasma stream through a restrictive throat of about one millimeter. The converging geometry rapidly compresses the hot plasma with minimal turbulence and heat losses while maintaining the plasma stream's laminar flow. Pressures inside the plasma reactor are proportional to the RF power being applied to the RF antennas. The applied RF power is optimized to produce a sonic flow of plasma species which can carry the vaporized nanoparticles. The RF power applied also strongly affects aerodynamic focusing and deposition rates. The optimal aerodynamic focusing of the generated plasma beam is characterized by a low divergence angle and a minimal crossover δ at a reasonable deposition rate of around two micrometers per second.

With reference to FIGS. 4A, 4C, and 5, the typical distance between each orifice in each nozzle 112 and its respective extractor hole 108 is about one millimeter. This is so an electric field will develop between the negatively charged orifice and the grounded extractor. The nozzle itself provides some aerodynamic focusing but with a large convergence angle. The extractor 108 sharpens the focus, like a short electron lens, to a plasma spot of about 0.1 millimeter at some focal plane. This spot is small enough for the plasma beams of array 110 to penetrate the inlets and get down deep inside the gas flow passages 103.

FIG. 5 shows a practical way of glass blowing 500 to implement multibeam nozzles 112 in the bottom end of lower quartz confining tube 114. Here, the sides of the tapered nozzle are shown open, but that is only for purposes of this illustration. The whole bottom end of lower quartz confining tube 114 tapers (front and back) into a wedge with a saw-toothed edge to bring the plasma inside down to a point for supersonic ejection from several orifices in an array that can each be as small as one millimeter in diameter.

Our theory on how plasma beams 111 in array 110 penetrate the gas distribution plate passages is laid out in steps over FIGS. 6A-6E. A precise alignment of the discharge chuck relative to the plasma beam is required as a precondition. The axis of a gas flow passage must be brought into coaxial alignment with the axis of a corresponding plasma beam 111. The design of plasma chuck 104 must accurately provide for such adjustments.

Figure 6A:
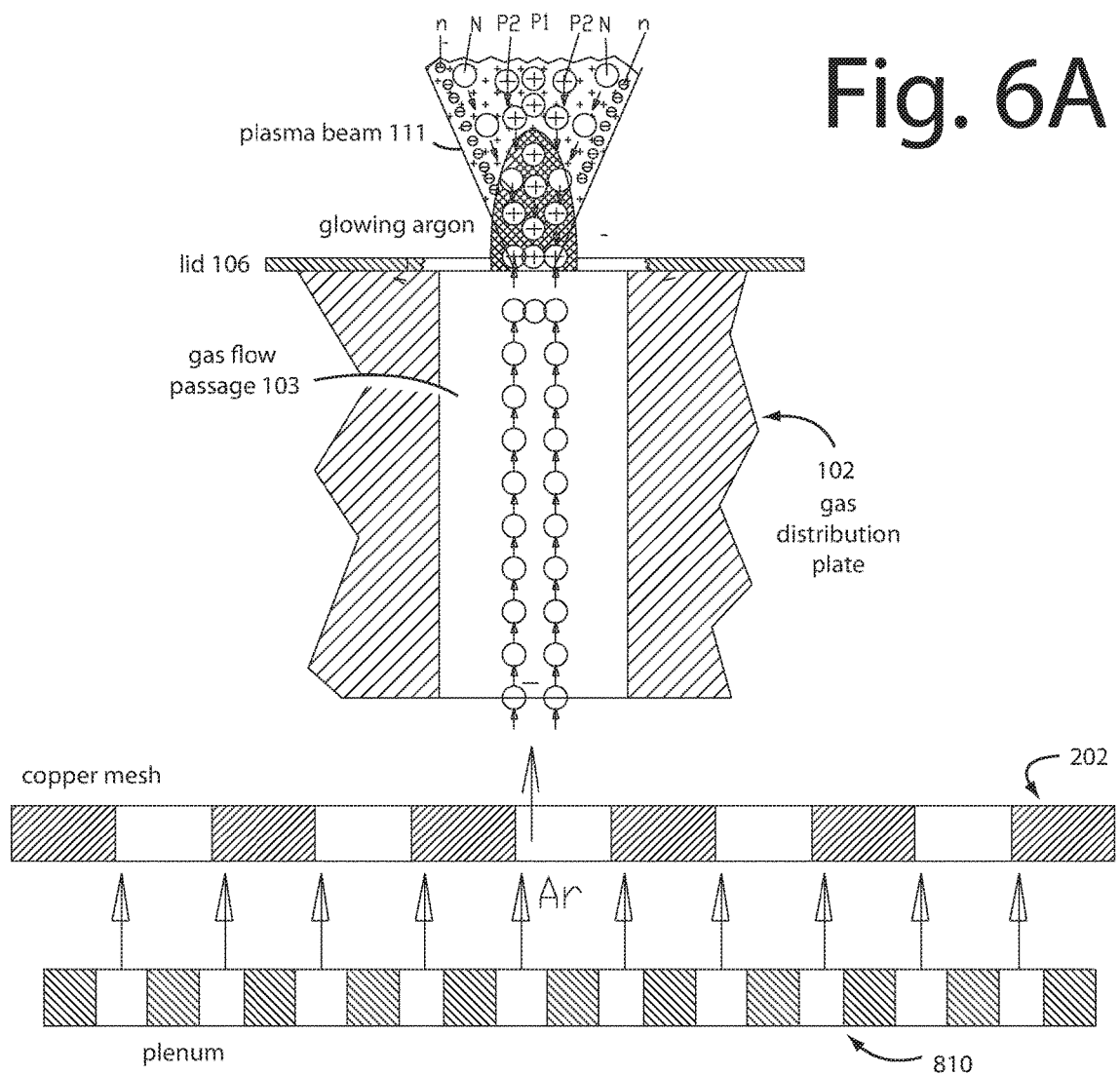

FIG. 6A displays a gas flow passage 103 aligned with a plasma beam 111. Each plasma beam comprises halo electrons "h", axial ions "P1", paraxial ions "P2", and neutrals "N". During processing, lid 106 is dropped down on the gas distribution plate surface to seal off the other passages. Everything is turned off except an argon supply line that fills the inner compartment of the vacuum discharge chuck. That provides a flow of argon gas Ar "A" to fill the atmosphere through the plenum, grounded mesh, passage, and inlet.

Ar flows up moving against the plasma beam. These Ar atoms collide with electrons n, axial ions P1, paraxial ions P2, and neutrals N. Some are ionized and enrich the plasma density of the plasma beam. A brighter glow when approaching the inlet tip of the plasma beam occurs that can be sensed by light detectors and give feedback that the plasma beam has properly targeted the passage and they are aligned.

FIG. 6B represents how plasma beams can encounter congestion inside gas distribution plate passages caused by a Debye sheath layer. Accumulating electrons impede deeper penetration. FIG. 6B shows halo electrons "h", axial ions "P1", paraxial ions "P2", and neutrals "N", just above a gas flow passage inlet.

Continuing plasma beam equilibrium depends on the distribution of these charges across a cross-section. Initially, within aerodynamically accelerated plasma beam 111, positive ions P1 and P2 and neutrals N fly tight together along the axis. The halo electrons h wrap around in a jacket on the periphery.

Plasma beams 111 trying to enter such millimeter scale gas flow passages 103 will suffer undesirable plasma beam degradations caused by adverse space charge effects. Stronger, Coulomb interactions can be expected with increases in the plasma density as the focal plane is approached.

Free in the atmosphere, the spatial distribution of potentials in a space charge are compensated by a negative electron halo formation around a positive core. These halo electrons are produced by residual gas ionizations and recombination processes inside beam 111, and compensate the space charges the potentials in the positively charged plasma beam core.

However, plasma beams 111 moving through narrow gas flow passages 103 become impeded by the very halo electron they lose to the inside walls. But the effects cannot be explained just by incomplete neutralization of the beam space charge caused by losses of the halo electrons. The plasma beam 111 gets congested by a collective behavior of three effects, including the space charge, Debye sheath and recombination processes.

As plasma beam 111 loses its halo electrons, the beams diffuse because the space charge electrical forces are no longer being compensated. So ions push out from the beam. The plasma beam loses both its negative and positive species and becomes completely diffused.

The Debye sheath layer is supplied mostly by halo electrons that stuck on the inside walls and builds from pieces of the plasma beam into a plug. The halo electrons continually enlarge the Debye layer down the gas flow passage walls to the outlet. FIG. 6B.

The Debye sheath has a negative potential of around 5 eV. The penetrating energy in plasma beam 111 is only around 0.04 eV. The Debye sheath potential will prevail, causing halo electron deflections, recombinations, and beam dissipation. The gas flow passage gets congested and impedes the plasma beam.

Near a sheath boundary, all negative species will be repelled, and all positive ions which reach that far in will turn into the gas flow passage wall and away from their original path down the gas flow passage. However, fast neutrals will soar unimpeded past the Debye layer "Db" and out through the gas flow passage outlet. Although the plasma beam is not completely stalled, it is demoted into a molecular beam.

The fast neutrals penetrate gas flow passages 103 and make it down into the vacuum discharge chuck and through copper mesh 202. Depleted streams like this cannot be used as carriers for etching gases or vaporized nanoparticles.

FIG. 6C shows a method embodiment of the present invention of eradicating Debye layers using an auxiliary CCP discharge 200 specially generated in the vacuum discharge chuck. A low-pressure capacitively coupled plasma (COP) discharge in an argon flow directed from plenum grate 810 (FIG. 8) through copper mesh 202 is powered by an RF generator. The discharge pushes near the underside of the GDP workpiece 102, and especially at the gas flow passage outlets. There it ionizes atoms of argon that are attracted by the Debye layer's negative potentials. The ionized argon atoms accelerate up inside each gas flow passage guided by the plasma beam 111.

The energies these ions gain from the Debye potential is enough to knock out electrons sticking on the outlet walls and produce an ion-electron emission.

The ion-electron emission, the Debye sheath potential, the positive ion supply from the COP discharge, and the neutrals molecular flow supply coming through from the inlet all create the conditions needed to launch a hollow discharge inside the gas flow passage. Particularly in the passage outlet The hollow discharge neutralizes the Debye layer, starting in the outlet, and propagates up inside the congested gas flow passages. Eventually, the propagating hollow discharge couples the plasma beam with the CCP discharge. The gas flow passage then clears itself of the congestion caused by the Debye layer.

Figure 6D:
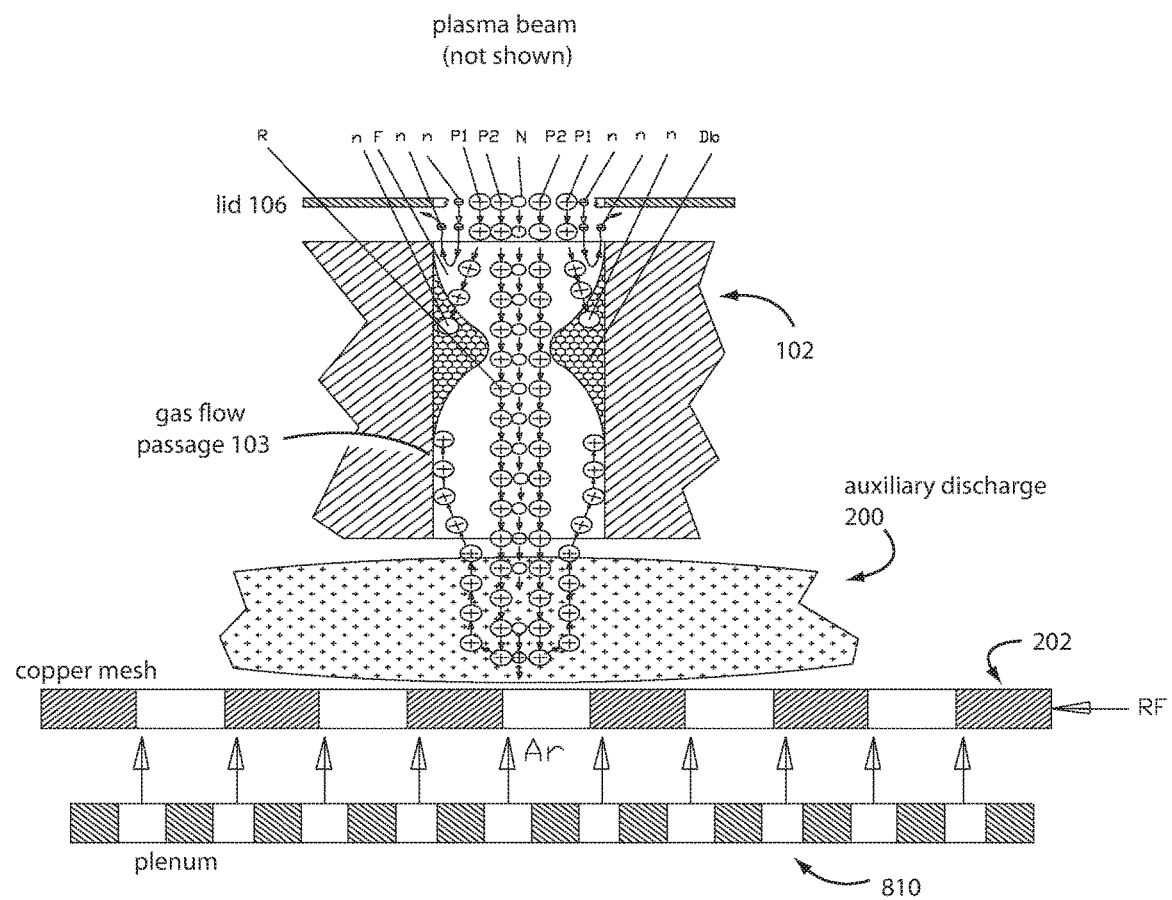

FIG. 6D exemplifies a breaching and weakening of the Debye layer Db by the plasma beam and the hollow discharge. At, some point in the gas flow passage, the Debye layer becomes weak enough for the positive ions in the plasma beam 11 to breach and travel down to the COP discharge and copper mesh 202. As it propagates down through the gas flow passage, plasma beam. 111 eventually connects through copper mesh 202 and the RF generator.

Figure 6E:
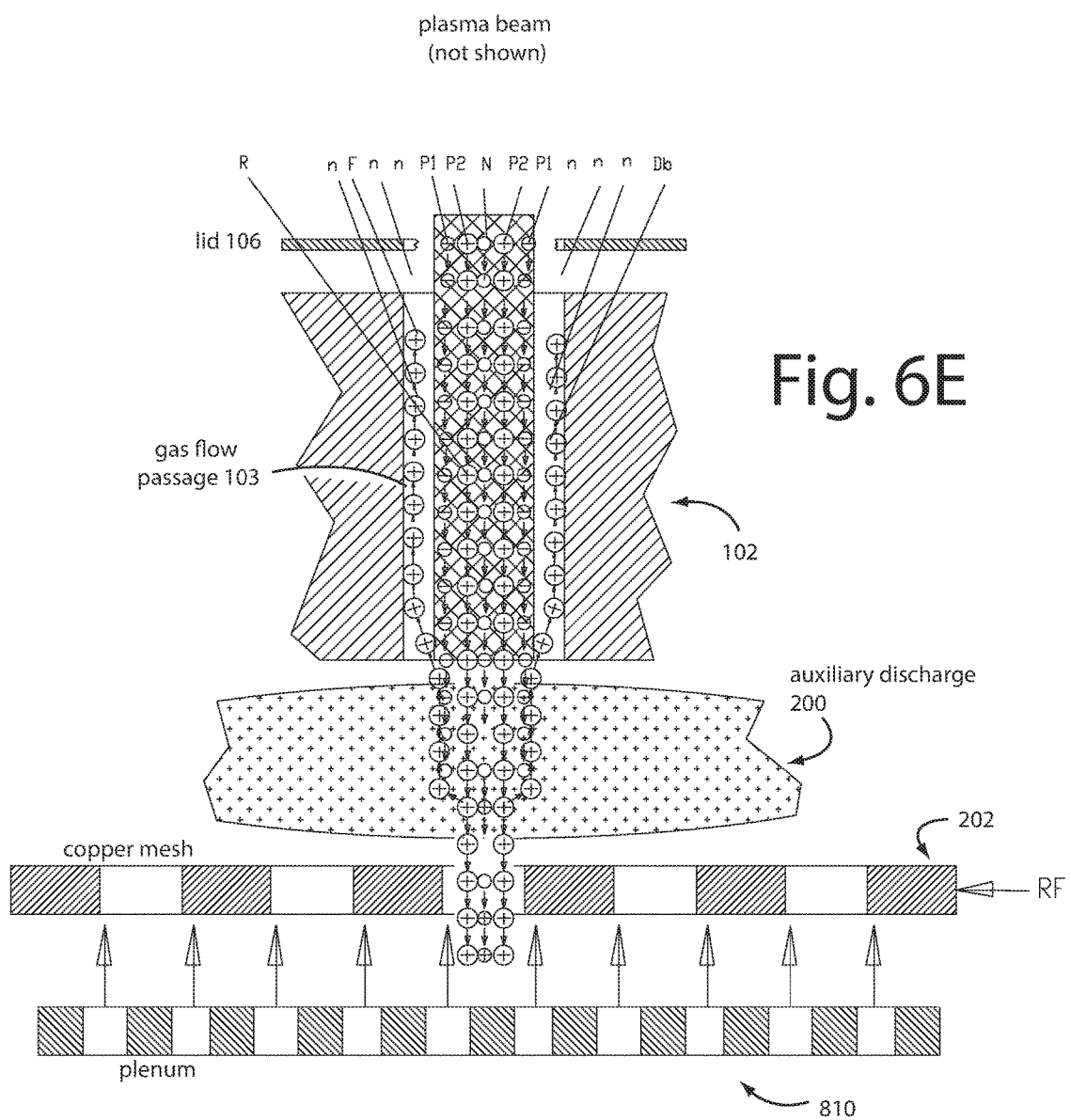

FIG. 6E illustrates a final phase in the penetration when the RF generator discharges through the plasma beam up through the gas flow passage. A filament-like high conductivity streamer develops that moves up through the plasma beam in the reverse direction.

FIG. 7 represents a twenty nanometer diameter nanoparticle 702 that will be used to coat the inside walls of a gas flow passage. But before nanoparticle 702 can be used it has to be pre-melted at 600° C. to reduce the surface forces in a melted shell 704. Then it is liquefied at 1200° C. into a melted drop 706 in the upper plasma reactor. The lower plasma reactor vaporizes it at 2000° C. to produce a nanopowder vapor 708 to be carried in with the plasma beams in array 110.

Commercial nanopowders less than twenty nanometers in diameter are required to produce good results. Such nanopowders are difficult to vaporize directly in plasma reactors because of their large surface areas and specific surface energy. The melting point of nanoparticle of $Y_2O_3$ can be reduced to less than half in comparison to the bulk material. Pre-melting of the nanoparticles at temperatures of 600° C. helps with their later vaporization in the plasma reactor because the specific surface energy is disrupted. The vaporization powers necessary in the plasma reactor can thereby be reduced. This reduces the thermal loads and increases the reactor lifetimes.

The so-called melting point depression (MPD) phenomenon is employed by us here to improve the complete vaporization of nanopowders. The beneficial effects of MPD will diminish with any aggregation of the nanoparticles into clusters. The forces that cluster nanoparticles together include van der Waals bonds. such bonds can be annihilated by applying Coulomb forces. Our method of charging the nanopowder clusters with a negative plasma species using the DBD line 136 electrically imparts the necessary repulsive forces to each nanoparticle. This results in the levels of cluster de-aggregation required.

MPD melting starts at a crystal's surface. The atoms at the surface are less coordinated than those in the interior. So a surface shell will have a lower melting temperature than does the bulk material. In cases where the surface is a significant part of the volume, as in nanoparticles, the melting point will be much lower. Melting normally starts in the surface shell layer, and propagates inwards to the core.

Moving on now to FIG. 8 and vacuum discharge chuck 104, high current RF plasma filaments must be avoided because they can erode the gas flow passage walls in GDP workpiece 102. Three controls are available for this, (1) adjusting the gap between copper mesh 202 and GDP workplace 102, (2) limiting the level of RF power applied, and (3) maintaining an optimum flow rate of argon from plenum 810.

The plasma beam 111 from above in array 110 is boosted from below with additional heat and an ionized species from auxiliary CCP discharge 200. Together, these keep plasma beam 111 from getting stalled in the Debye sheath congestion. RF plasma filaments are generated that stretch out and reinstate the delivery of etching gases and vaporized nanoparticles so they can get completely all the way down to reach the gas flow passage outlets and do their work.

Our etching of the gas flow passages 103 proceeds by pushing in HCl from both above and below. We get the HCl etching gases below from the CCP discharge that ionizes the HCl. An HCl supply injected into vacuum discharge chuck 104 gets pushed up through plenum 808, grate 810, and copper mesh 202 up into the COP discharge, and the ionized HCl pushes into the gas flow passage outlets.

Plenum grate 810 is located just beneath copper mesh 202 by about five millimeters. It's completely fenestrated with holes about 0.5 mmm in diameter to provide a uniform distribution of argon flow that will promote a more even auxiliary CCP discharge 200. Plenum 808 is connected to an argon supply 806. Copper mesh 202 is electrically connected to an RF generator through a load-matching device.

The manifold is connected through the port 120 to the argon supplying line and through the port 121 to the HCl supplying line. All these connections are managed by mass flow controllers (not shown) set to establish a low pressure discharge gas mixture inside the inner compartment. A CCP discharge can thereby be simultaneously sustained with a vacuum extraction of the spent plasma.

Copper mesh 202 rests on inner glass ring 802 and these can be z-lifted to fine tune the small one millimeter gap above copper mesh 202. Compressed air is fed it to a central coaxial bellows 822. Outer and inner bellow sleeves are welded together to produce a stable non-tilting platform. A "bellows cavity" to receive compressed air is enclosed between the bellows. At the center is an inner compartment that is used as a conduit for argon and HCl in plasma discharge 200.

The gap between the bottom surface of the GDP workpiece 102 and copper mesh 202 controls the auxiliary CCP discharge 200 with precise adjustments by compressed air 824.

An ability to z-adjust copper mesh 202 is needed because copper mesh 202 is not very flat, relative to the optimum one millimeter gap. The RF power applied across the gap must sustain the auxiliary CCP discharge 200, but not allow surface sputtering of copper of mesh so near the underside of GDP workpiece 102. The gap must therefore be adjusted with each new positioning of GDP workpiece 102.

FIG. 8 shows CCP vacuum discharge chuck 104 of FIG. 1 in more detail. The sealing necessary on the top of vacuum chuck 104 is provided by sealing lid 106. Too much air leakage would occur if lid 106 was not used to cover all the gas flow passages 103 in the gas distribution plate not being exposed. During positioning, lid 106 is lifted up so the CNC system can shift the vacuum discharge chuck for its positioning relatively to the beam in order to expose for such treatment each gas passage. The clearance for such movement is controlled by the drop mechanism.

Discharge chuck 104 is principally divided into an inner compartment to bring argon or HCl in as a discharge gas for auxiliary CCP discharge 200, and an outer compartment to exhaust out all the spent gases. These two compartments are respectively defined by inner and outer glass rings 802 and 804. These glass rings provide both the gas containment and the electrical isolation needed between copper mesh 202 and GDP workpiece 102 which sit on top of each.

RF power is applied through a load matching device between the copper mesh 202 and the GDP workpiece 102 in a capacitively coupled plasma (CCP) arrangement that generates a positive species auxiliary plasma 200 in either of the Ar and HCl discharge gases supplied from below.

The inner compartment receives the discharge gas under pressure pushed up inside a plenum 808 and through a Teflon grate 810. The Teflon grate 810 has fenestrations to uniformly distribute the argon and HCl flows and send them toward and through copper mesh 202. CCP discharge 200 clouds just under a portion of the bottom side of GDP workpiece 102 and just above copper mesh 202 in a small gap of about one millimeter. Such gap is critical and therefore must be finely tuned.

The spent gases in the outer compartment inside glass ring 804 and outside glass ring 802 are vacuum exhausted by a vacuum pump through an exhaust port 820.

The optimum one millimeter gap between GDP workpiece 102 and copper mesh 202 is made adjustable by a z-lift bellows 822 that is pneumatically controlled by varying the air pressure applied at a compressed air port 824. A z-adjustment 826 should move copper mesh 202 up high enough to initiate positive species auxiliary plasma 200 in the discharge gases, but not so close as to produce arcing and sputtering.

The interior vacuum of chuck 104 is enough to hold GDP workpiece 102 firmly in place, while remaining well sealed to outer glass electrode ring 804. A CNC x-y positioning table (not shown) is included to properly position the GDP workpiece 102 so the plasma beam array 110 is always aligned with a chosen set of gas flow passages 103. Such alignment can be confirmed with detectors to sense glows in the discharge gases at the entries of the gas flow passages 103 during setup. FIG. 6A.

A lifting/dropping mechanism is included to lift sealing lid 106 up when the GDP workpiece 102 is to be repositioned, and lets it drop back down once the gas flow passage addressing is complete. The GDP workpiece 102 typically has over nine hundred gas flow passages 103 and it would be difficult to maintain the required atmosphere underneath if most of these were left uncovered.

FIGS. 9A and 9B represent dielectric barrier discharge line 136 of FIG. 1 in more detail. Schematically, in FIG. 9A, several needles 900 with sharp points are each respectively disposed in a narrow blind channel 902. An inflow of nanopowders 904 is received from a cloud generator 1300 (FIGS. 13A-13C). The needles 900 must operate in an argon atmosphere. Nanopowder cluster aggregates 904 to be de-aggregated flow into a main glass tube 906 from the left, and then move right past several energized tips of needles 900. Individual nanoparticles 908 in clusters 904 are jolted with a negative charge of electrons from the tips of the needles. Each nanoparticle takes on a negative charge and will thereafter repel one another. The cluster will disband. Newly de-aggregated individual nanoparticles 908 flow out of main tube 906 to the right. The nanoparticles can now take advantage of melting point depression effects.

RF power 910 is applied to all the needles 900 in parallel with an inductor 912. The outside of main glass tube 906 has a conductive coating 914 that is painted on or sputtered on in a metallic film. Conductive coating 914 is grounded. Just inside main glass tube 906 an electron charge layer 916 will collect to form a virtual capacitor ($C_{virtual}$) 918. Such combination virtually creates an RLC generator 920 that operates in resonance to produce large voltages on the needles 900 without requiring large amounts of RF power 910.

Nanopowder is injected after being extracted from its package with a puncher 1202 (FIGS. 2 and 14). The cloud generator accumulates a portion of the powder into a vibrator, stirs it with an interior propeller, and shakes it with a rocking-wave generator to produce a nanopowder cloud 1302. A turbo-pump 1214 sucks up nanopowder cloud 1302 and pushes it to the dielectric barrier discharge line 136 for de-aggregation.

If dielectric barrier discharge line 136 was conventionally constructed, too many nanopowders would collect on the tips of needles 900 and foul them. So individual flows 922 of argon gas is inserted into the middle of each narrow blind channel 902 from a distribution manifold 924. This causes a distal argon wind to stream off the tips of needles 900 such that the nanopowders cannot attach and stick easily.

Dielectric barrier discharge (DBD) line embodiments of the present invention are quite novel. Conventional DBD lines proved to be inadequate and unsatisfactory in these applications. Conventional DBD's require a high RF power to initiate, and this can cause the discharge to be overheated.

Our DBD line 136 is novel in that it is powered by a RF current that flows into inductor 912, not just needles 900. The inductor accumulates energy in its magnetic field that creates high voltage peaks between the electrodes as it resonates. The needles' sharp points form a field emission triple-point in an electric field that readily ejects electrons.

During each negative voltage half-cycle of the alternating RF power 910, the needles each send out steamers of electrons to pass through the flow of argon on their way to ground, e.g., the conductive paint. The dielectric material of the glass walls stops the electrons and causes them to film inside the glass wall. Mirrored dipoles develop in the grounded conductive paint layer on the wall just outside.

These dipoles keep the electron film in place on the inside surface. The electrons accumulate after many cycles to build a large charge and high accumulated voltage.

On positive voltage half-cycles of the alternating RF power 910, the accumulated electrons leave the glass surface inside and fly back toward the needles in a now positive electric field. The voltages accumulated are so strong the currents produced are able to breakdown the argon.

A virtual capacitor $C_{virtual}$ develops between the conductive grounded layer on the outside wall and the piled up electron layer deposited on the inside surface. The glass acts as the dielectric of this capacitor. This virtual capacitor $C_{virtual}$ and a properly chosen inductor wired in parallel are operated in resonance, e.g., at 13.56 MHz.

The resonance will sustain a DBD discharge at a relatively low RF power input investment, because accumulated energy is stored in the virtual capacitor and in the inductor. At resonance, the parallel circuit impedance reaches to maximum and the voltage swings across the inductor can reach very large maximums.

The inclusion of an inductor in parallel with the DBD load is novel and enables operation with only very low RF power levels.

Straight flows of $Y_2O_3$ nanoparticles at right angles past the needles 900 can lead to fouling with ceramic deposits and those will seriously degrade the DBD's performance. So, an auxiliary flow of argon is plumbed in to enter behind each needle's tip. A shield gas then flows around the discharging tips to keep the nanoparticles away. These tips can generate their local discharges free of the risks of fouling by not being immersed in nanopowder.

FIG. 10 represents a method 1000 for extending the service life and for refurbishing worn/damaged aluminum gas distribution plates using the AP-ICP treatment system like that illustrated in FIGS. 1-9. The sequence steps of method 1000 are preferably automated with a microcontroller, but here we describe the constituent manual steps.

In the case of refurbishing gas distribution plates made of billet aluminum, there will be chemical reaction byproducts of $AlF_3$ left behind in its prior life that must be washed away. Plasma beams formed from atomic hydrogen are used to do this as well.

There are five basic sub-goals that are to be accomplished by method 1000: 1) The inside walls of the gas flow passages 103 must be cleaned of contaminants of prior-life PE-CVD process with plasma beams formed from hydrogen chloride gas (HCl), 2) The chemical reaction byproducts left behind by such HCl plasma cleaning must be rinsed away with plasma beams formed from atomic hydrogen, 3) The surfaces of the passage walls must be pre-heated with plasma beams formed from argon gas to better adhere a nanocoating of Yttrium oxide nanopowders in a $Y_2O_3$ vapor, 4) The surfaces of the passage walls must be exposed to a $Y_2O_3$ vapor carried in by plasma beams formed from argon gas to improve the gas distribution plates with plasma-chemical corrosion protection, and, 5) the deposited layers of $Y_2O_3$ nanopowders must be annealed by heating from plasma beams formed from argon gas so they better adhere to the surfaces of the walls of the passages.

Method 1000 starts by lifting up sealing lid 106 and loading in a next GDP workpiece 102 into the top of vacuum discharge chuck 104. A step 1002 x-y positions the gas distribution plate with a CNC-stage and drops the sealing lid 106 back down. The CCP auxiliary CCP discharge 200 under the gas flow distribution plate 102 is lit and operational.

Refurbishment processing begins with a two-step etching. A step 1004 cleans the inside walls of the gas flow passages 103 of contaminants with plasma beams 111 formed from hydrogen chloride gas (HCl). A step 1006 changes the discharge gases selected for inflow at the Teflon top flange 130 to hydrogen chloride gas (HCl).

A step 1008 rinses away the chemical reaction byproducts left behind by such HCl plasma cleaning with plasma beams formed from atomic hydrogen. A step 1010 changes the discharge gases selected for inflow at the Teflon top flange 130 to atomic hydrogen (H) that has been disassociated by the dielectric barrier discharge line 136 from molecular hydrogen gas (H2).

A dense enough nanocoating in gas flow passages 103 requires that the $Y_2O_3$ nanoparticles to be completely vaporized after the inside surfaces are pre-heated to 550° C. The layer of $Y_2O_3$ deposited will have an amorphous microstructure as a result of nuclei-less ballistic deposition. Finishing with a fusion step anneals the new surface of the $Y_2O_3$ amorphous layer for better adhesion.

A step 1012 pre-heats the surfaces of the passage walls with plasma beams 111 formed from argon gas. A step 1014 changes the discharge gases selected for inflow at the Teflon top flange 130 to argon gas (Ar).

A step 1016 exposes the surfaces of the passage walls to a $Y_2O_3$ vapor carried in by plasma beams 111 formed from argon gas. A step 1018 changes the discharge gases selected for inflow at the Teflon top flange 130 to argon gas (Ar). Pre-melted Yttrium oxide nanopowders in a $Y_2O_3$ vapor are supplied by dielectric barrier discharge line 136. Several mass flow controllers 134 are configured in parallel to distribute a uniform coating via each plasma beam 111.

A step 1020 anneals the deposited layers of $Y_2O_3$ nanopowders by heating with plasma beams formed from argon gas. A step 1022 changes the discharge gases selected for inflow at the Teflon top flange 130 to argon gas (Ar).

A step 1024 asks if the last set of gas flow passages 103 has been treated. If not, step 1002 is repeated. A step 1026 releases the vacuum seal on the gas flow distribution plate for removal.

FIG. 11 represents a way of addressing and aligning the nine hundred or so gas flow passages 103 in a typical GDP workpiece 102 that are set in radial groups. Eight gas flow passages 103 at a time are brought under the multi-beam plasma array (e.g., AP-ICP torches of FIGS. 1, 2, 3, 4A-4C, and 5). In one embodiment, the torches are fixed above GDP workpiece 102 and can move only vertically. It is GDP workpiece 102 that is rotated and x-y positioned beneath.

Given eight plasma beams in array 110, and nine hundred gas flow passages 103 in GDP workpiece 102, the GDP workpiece 102 would need to be repositioned at least one hundred and thirteen times to complete the refurbishment of one GDP workpiece 102. It is assumed here the inter-beam spacing between plasma beams in array 110 matches some whole multiple of the radial and inline spacing of the gas flow passages 103 in GDP workpiece 102.

FIG. 12 illustrates a three-stage, batch delivery, nanopowder cloud supply sub-system 1200. In a first stage, a package puncher 1202 accesses a nanopowder in a package 1204 and an argon puff 1206 blows the nanopowder in through a three-way valve 1208. Then in a second stage, a nanopowder cloud generator 1212 spins up and whips the nanopowder into a cloud by spinning its impeller vanes. Lastly, when ready, a third stage switches three-way valve 1208 to receive an argon push 1210 that assists a turbo-pump 1214 to suction out the nanopowder cloud and deliver it in one batch to a dielectric barrier discharge line 1216 for de-aggregation of its nanoparticle clusters.

The nanopowder cloud generator 1212 requires constant agitation, vibration, and rocker-shaking, e.g., to minimize the aggregation of nanoparticles that tend to collect on the inside walls. Its impeller is spun at 360 rev/min, the whole assembly is vibrated at one kilohertz, and a rocker-shaker device cycles at 3-4 times a second.

The three-stage nanopowder cloud generation operates in batches, it cannot supply materials in a constant stream. So the third stage operation has to be synchronized to occur at those times when the gas flow passages 103 in the gas distributing plate 102 have been readied to receive the nanopowder vapors.

The delivery of prepared nanopowders in clouds and the overall flow rates possible is limited by a number of the devices involved. The turbo-pump has a very limited suction rate, the de-aggregator cannot work effectively at high feeding rates, the top plasma torch also cannot pre-melt high flows of nanopowder, and the bottom torch cannot vaporize large amounts of nanopowder. The plasma beam nozzle orifices can get clogged if too much nanopowder vapor is pushed, and the plasma beam penetration will be doused. Bottom-line, good adhesion quality during deposition can only be pushed so much because the pre-heated surface of the inside walls of the passages cannot accept a lot of vapor if it is to fuse well into the metal. So good nanopowder delivery and deposition can be tedious and challenging to control.

FIGS. 13A-13C illustrate a nanopowder cloud generator 1300 that could be used as the nanopowder cloud generator 1212 in FIG. 12. Nanopowder cloud generator 1300 is generally constructed of glass so an operator can visually confirm the presence and status of a nanopowder cloud 1302 inside.

FIG. 13C shows the nanopowder cloud generator in a "normal" vertically standing orientation in which the impeller shaft 1310 is at the top and a nanopowder well 1313 is down at the bottom. A rocker-shaker, heater, and vibrator (not shown) tilt the bottom up in a rocking motion 3-4 times a second, while vibrating at one kilohertz, and heating to keep nanoparticles from clumping or sticking on the inside surfaces. The heating also drives out moisture and prevents water condensation.

Nanoparticles in an argon gas carrier from package puncher 1202 initially enter intake 1316 and into a sleeve compartment 1307 in between the inner glass electrode 1306 and an outer glass electrode 1312. Each new nanopowder cloud 1302 is whipped up in a batch by spiral twisted impeller vanes 1304. These lift the nanoparticles up and spin them in a vortex 1305 within an inner glass electrode 1306.

Intakes 1316 and 1318 and their connection to compartment 1307, as seen in FIG. 13C, essentially constitute the three-way valve 1208 of FIG. 12.

The production of each new nanopowder cloud 1302 may take some time, but when it's ready, an argon gas pusher is applied to intake 1318 to help turbo-pump 1214 pull it out exhaust port 1320. The timing of each new batch of nanopowder cloud 1302 is controlled by synchronization signal 1220.

The cloud exhaust 1320 in the throat 1314 serves to withdraw the nanopowder cloud to the turbo-pump. A top portion of the throat above hole serves also as a bushing nest for impeller 1310. The bushing ring is made of Teflon. Nanopowder carried in with argon from the puncher enters through the wall in outer electrode 1312 into compartment 1307 between the inner and outer electrodes of glass. The inner electrode 1306 stops short, where nanopowder is dropped in the bottom well 1313.

Spiral twisted impeller vanes 1304 break up the nanopowder flow and do not allow it to drop back into the bottom. The nanopowder flow spins up in a rotating vortex 1305, and eventually up to and into throat 1314. During this tornado-like cloud generation period, a valve from puncher 1202 must be closed so no more nanopowder can come in or be blown back.

The time required to be off-line depends on the impeller revolutions, frequency of the rocking wave generator, and vibrations applied. This time off is used productively to x-y step the gas distribution plate under the array 110 from one corresponding array of gas flow passages 103 to another. The plasma beams 111 are left running, but no nanopowder is injected into them.

When the plasma beams are exposed to a next new array of gas flow passages 103, a valve opens to a puffing argon 1210 that assists the rather weak turbo-pump 1214 to exhaust the nanopowder cloud out from the cloud generator.

The cloud generator has a housing that is double-walled and surrounds coaxially rotating impeller vanes. The $Y_2O_3$ nanopowder in argon is received into the spaces between the walls from the bottom. The impeller vanes 1304 further disperse the nanopowder in the carrier argon. Constant rocker-shaking is needed because the clouds generated would otherwise just lay in the bottom. The changing positions lift the bottom up and slosh the cloud 1302 around.

The strong vibrations applied also help keep particles from the cloud 1302 from accumulating on the inside walls. The high speed vanes 1304 help break apart large clumps and mechanically separate the smaller clusters for better de-aggregation in the dielectric barrier discharge line 136.

FIG. 14 shows a nanopowder package puncher 1400 in more detail than in FIG. 12. A top flange 1402 has four punch heads 1404 like twist bit drills that each retract into a silo nest 1406. Each punch head 1404 has a punch stem 1407.

Four packages of nanopowder 1408 can be loaded two-by-two on a mesh 1410 in a middle flange 1412. Each lays against its own punch head 1404 in a compartment between the top and the middle flange. This compartment is filled with argon gas. Each package is good for one-day of work only, because nanopowder powder is perishable. So just one rotating punch is raised from the silo nest to rupture a fresh package. The nanopowder drops down through the mesh onto a flexible membrane 1414. Membrane 1414 is vibrated by pulsed argon gas supplied through a nipple 1416. The nanopowder is then inhaled with the argon puffed into the puncher back through nipple 1416 and into cloud generator 1300.

Nanopowder is very expensive and has a short lifetime even if stored in argon. This simple system 1400 helps extend the storage life as best as can be done once the package is opened.

The remaining FIGS. 15A-15E and 16 are related to the refurbishment of silicon gas distribution plates that require restoration of silicon material lost in exposure of the gas flow exits to process etchants.

In summary of our aluminum gas plate refurbishment, three complex physical models are important: 1) our novel dielectric barrier discharge, 2) our novel way of extracting and focusing the plasma beams 111 from nozzles congested with Debye electrons, and 3) our novel methods to get plasma beams to penetrate narrow gas flow passages 103 also congested with Debye electrons.

With regard to our novel dielectric barrier discharge illustrated in FIGS. 9A and 9B, needles 900 eject electrons during each negative peak of the RF half-wave. But such electrons cannot get to ground in the grounded conductive paint because they cannot penetrate the dielectric barrier glass. If the electrons were left to simply deposit on the inner glass surface, they would quickly spread all over the total glass surface and be lost to any useful purpose.

A force is needed to sustain the free electrons in place proximate the tips of the needles. A mirrored positive charge can be positioned against each electron by grounding a smooth, highly conductive paint, or a magnetron-sputtered aluminum film just outside on the glass barrier. The glass wall should be thin, about a half of a millimeter (0.5 mm) thick.

The electrons and their mirrored positive charges create strong dipoles that, in own turn, create strong sticking forces that will accumulate the electrons over extended periods. A virtual capacitor exists then between the layer of electrons and the conductive outside layer.

Large electron charges flow onto the needles during the positive half-wave peaks of the applied RF power. The electrons accumulated inside the glass fly off the inner surfaces and accelerate in the electric fields created. These break down only the clean argon that came from the ports on the sides above the needle tips, not the argon flow clouded with nanoparticles.

The accumulated energy in the coil produces very large voltage peaks on the tips of the needles. An independent circuit is thus formed through the coil, the tips of the needles, the virtual capacitor, ground and back to the coil again. Such circuit is a relaxation R LC generator. L is inductance of the coil, C—capacitance of the virtual capacitor, R—the breakdown resistance of the plasma discharge. The generator has its own resonant frequency $$f = \frac{1}{LC}.$$

The Rf generator has only to power a small coil. This is what is different from conventional devices that apply huge RF power straight from a matching network to the needles without any inductive loading or resonance.

Many of the components and concepts described and discussed above are applicable to our system and method for refurbishing silicon gas distribution plates as marketed by Tokyo Electron Ltd (TEL), Lam Research, and others.

FIGS. 15A-15E illustrate the use of our modified Bosch Process to repair the outlets of gas flow passages in silicon gas distribution plates 1638. The conventional Bosch Process applies a passivation layer in repeated steps interdigitated with anisotropic etching steps. Embodiments of the present invention deposit silicon from vapors instead of the passivation layer. Our solutions to the Debye congestions in the nozzles 112 and gas flow passages 103 that impede plasma beams 111 apply here as well.

FIGS. 15A-15C represent a three-step cycle for: (1) silicon deposition, (2) anisotropic etching that follows crystal planes, and (3) annealing/bonding. FIG. 15D represents how a sliding movement of the silicon gas distribution plate is accommodated to treat a next gas flow passage 1636. FIG. 15E represents how an argon glow 1634 at the outlets of gas flow passages 1636 in silicon gas distribution plates (showerheads) 1638 under the plasma beam 1624 can be used as a visual indicator of proper alignment. Each gas flow passage outlet 1636 has a typical cavity depth of 1.0-1.2 mm.

Silicon-type gas distribution plates 1638 are actually slices of a single crystal of silicon cut along its lattice plane. Anisotropic etching can therefore be used to etch deep cavities along crystal planes with near perfect vertical walls.

FIG. 15A represents gas flow passage 1636 (FIG. 16) during a first step of silicon (Si) deposition 1500 in the three-step cycle. A plasma beam 1624, is directed into an eroded outlet 1636 that suffered losses of silicon and needs to be repaired. An insulated bias lid 1502 and 1504, here 1628, is dropped down and its conductive top side serves as a RF bias electrode 1630. Argon gas 1510 is injected into discharge chuck 104 through plenum 810 and on to flow through mesh 202. A bottom auxiliary CCP discharge 200 is launched by applying RF power, and a top bias discharge 1506 is launched by applying a bias voltage to bias lid 1502.

Silicon nanoparticles 1602 are injected after de-aggregation into a top plasma discharge of a beam generation system 1600 like that of FIG. 16. These silicon nanoparticles are vaporized in a bottom plasma discharge of the beam generation system. A resulting silicon vapor flow is accelerated toward eroded gas passage outlet 1636.

Embodiments of the present invention suddenly reduce the velocity of supersonic silicon vapor flow proximate to where the silicon should be deposited by generating bias discharge 1634 in eroded passage outlets 1636. The top biased discharge 1506, 1634 slows down the vapor flow and diffuses it for better adhesion with the damaged walls. A superior quality silicon layer can thus be deposited on the sidewalls of the eroded cavity of gas flow passage.

FIG. 15B, represents what happens in gas flow passage 1636 during a second step of etching 1520 in the three-step cycle. The silicon delivery of step 1500 is turned off, as is the bias discharge 1634. Sulfur hexafluoride ($SF_6$) is injected into the top plasma discharge. A hot $SF_6$ vapor flow is created and then accelerated toward the gas flow passage outlet. Any weak aggregations of silicon that built-up in the outlet are knocked off and flushed. The inside walls of the gas flow passage are purged of loose particles to prevent interference later with silicon deposition.

FIG. 15C, represents gas flow passage 1636 during a third step of etching 1530 in the three-step cycle. A mixture of argon-hydrogen gas is injected into the plasma discharge as discharge gas 1608. This results in a mixed, high temperature argon-hydrogen plasma beam 1624 being output and directed toward outlet 1636. The inside walls of gas flow passage 1636 are heated enough to bond any deposited silicon layer into the crystalline structure of the silicon substrate of the gas distribution plate. Thereafter, the inside walls are purged of any remaining byproducts of the $SF_6$ etching.

One hundred of these three-cycle steps will typically be needed to restore the gas passages that were eroded in the showerhead.

FIG. 16 represents a plasma beam generation and bias discharge apparatus 1600 in an embodiment of the present invention for refurbishing worn silicon showerheads. Typical silicon showerheads suffer the most erosion to the gas flow passage outlets out on the periphery on the process face. These passage outlets can become so damaged that the silicon showerhead must be taken out of service even though the majority of gas flow passage outlets around the middle are alright. So when these silicon showerheads are refurbished, only those gas flow passage outlets out on the periphery will typically need any restoration treatment.

The complete plasma beam generation and bias discharge apparatus 1600 is similar in many ways to corresponding components described with FIG. 1. The plasma torch is basically the same AP-ICP two stage device with upper and lower reactors each with respective pairs of RF power antennas. The complete plasma beam generation and bias discharge apparatus 1600 produces, however, only one plasma beam 1624.

A source of nanoparticles 1602 enters at top from a nanopowder cloud generator, as in FIGS. 13A-13C, and must be de-aggregated as was done above with the dielectric barrier discharge line 136 of FIGS. 9A and 9B. Such nanoparticles 1602 are injected through by cylindrical central glass tube 1604. This is enveloped by an intermediate glass tube 1606 that enables an injection of a plasma discharge gas 1608.

A top plasma reactor includes a cylindrical top confinement tube 1610 to receive the nanoparticles and discharge gas. A top saddle RF antenna 1612 wraps closely around top confinement tube 1610. It is driven by RF power from load-matching networks, top saddle RF antenna 1612 is fine tuned to reduce reflecting waves. A top sheath gas 1614 is inserted through fine manifolds to surround the plasma produced inside the top plasma reactor. Thin jackets of inert gas like this protect the inside glass walls from the plasma.

A bottom plasma reactor includes a larger cylindrical bottom confinement tube 1616. This receives the plasma and any pre-melted nanoparticles from the top reactor. A bottom saddle RF antenna 1618 is wrapped closely around bottom confinement tube 1616. It is driven by a different source of RF power than the top to reduce cross coupling. This second RF source has its own load-matching networks, and it too is fine tuned to reduce reflecting waves. A bottom sheath gas 1620 is also inserted through fine manifolds connecting the top and bottom confinement tubes. Such surrounds the hotter bottom plasma produced inside the bottom plasma reactor in a thin jacket of inert gas that continues the protection of the glass walls.

A conical glass nozzle 1622 brings the plasma flow inside down to a millimeter scale point to produce an aerodynamic supersonic plasma beam 1624. Such is the equivalent of plasma beams 111 described above. Plasma beam 1624 is variably focused by an extractor 1626 to bring the plasma beam's focal plane coincident with various points inside the gas flow passages.

Extractor 1626 also functions to decongest the Debye sheathing buildup of electrons inside the tip of conical glass nozzle 1622.

A bias lid 1628 is similar to sealing lid 106, but has an important added function. Bias lid 1628 comprises two parts, a conductive RF electrode 1630 in a top layer electrically connected to receive an RF bias, and an insulative ceramic undercoating 1632 to electrically isolate the conductive RF electrode 1630. The bias lid 1628 is lifted up and down at various times by a simple mechanism not shown to accommodate movement of the silicon showerhead 1638.

A bias discharge 1634 can appear to glow at the top facing outlet 1636 of eroded gas flow passages when in alignment with plasma beam 1624. A silicon gas distribution plate 1638 is typical of those manufactured by TEL and Lam Research.

In summary, a principal advantage of the AP-ICP reactor embodiments of the present invention is their flexibility in being able to vary coating architectures and processing conditions by focusing of plasma beams 111 and 1624. Our AP-ICP focused beam system 1600 is like a 3D-printer in its ability to penetrate narrow and deep hollows like the passages in wafer etching showerheads. Dense coatings can be simultaneously deposited in plasma spray-physical vapor deposition (PS-PVD) of ceramics for protective coatings of columnar microstructures. These can be superior to splat-like coatings applied by atmospheric plasma spraying (APS).

B. J. Harder and D. Zhu, of the NASA Glenn Research Center, Cleveland, Ohio, wrote a Paper tiled, PLASMA SPRAY-PHYSICAL VAPOR DEPOSITION (PS-PVD) OF CERAMICS FOR PROTECTIVE COATINGS. They concluded that in order to generate advanced multilayer thermal and environmental protection systems, a new deposition process is needed to bridge the gap between conventional plasma spray, which produces relatively thick coatings on the order of 125-250 microns, and conventional vapor phase processes such as electron beam physical vapor deposition (EB-PVD) which are limited by relatively slow deposition rates, high investment costs, and coating material vapor pressure requirements. The use of Plasma Spray-Physical Vapor Deposition (PS-PVD) processing fills this gap and allows thin (<10 µm) single layers to be deposited and multilayer coatings of less than 100 µm to be generated with the flexibility to tailor microstructures by changing processing conditions. Coatings of yttria-stabilized zirconia (YSZ) were applied to NiCrAlY bond coated super alloy substrates using the PS-PVD coater at NASA Glenn Research Center. A design-of-experiments was used to examine the effects of process variables (Ar/He plasma gas ratio, the total plasma gas flow, and the torch current) on chamber pressure and torch power. Coating thickness, phase and microstructure were evaluated for each set of deposition conditions. Low chamber pressures and high power were shown to increase coating thickness and create columnar-like structures. Likewise, high chamber pressures and low power had lower growth rates, but resulted in flatter, more homogeneous layers.

The extensive range of possible microstructures and fast deposition rates make our technology attractive in a wide range of applications, including wear resistant and electrically resistant coatings, diffusion barrier layers, ion-transport layers for fuel cell components, and gas sensing membranes.

In spite of the distinctive differences between AP-ICP and traditional plasma spraying, they both suffer from effects related to supersonic flows, e.g., ballistic deposition (BD). A ballistic aggregation mechanism grows structure via linear (ballistic) trajectories. BD particles drop in vertically random positions on an initially flat substrate and stick upon first contact. The antistrophic particle aggregation BD belongs to the so-called far-from equilibrium growth processes. Here, "far from equilibrium" means that particles are not allowed a relaxation to lowest energy states during the whole growth process.

A roughening happens in a way which is different from ordinary diffusion processes. Instead of ordinary diffusion process, a nucleation and nano-crystallization occur due to a sticking formation mechanism, the so-called kinetic interface roughening process. The influence of anisotropy interaction leads to a morphology of growing clusters formed by sticking particles that is characterized by high porosity and permeability.

A ballistic aggregation model suggests particles are added to a growing structure by linear (ballistic) trajectories. Other simple models include diffusion limited aggregation (DLA) and diffusion limited cluster-cluster aggregation (CCA). These can result in large scalloped and roughen sidewalls. The rough sidewalls cause problems with non-uniformity in the plasma etching of the wafers. CCA deposits are also a source of particle contamination in plasma processes.

Particulate contamination is exacerbated by any thermal cycling of the reactor components during repeated plasma processing cycles. Repeated heating and cooling of the plasma exposed surfaces of showerhead can cause the adhered silicon deposits to exfoliate or flake off due to CTE differentials between the silicon buildup and the silicon surfaces of the outlets. These silicon deposits can also become dislodged under bombardment by reactant species in the plasma.

Conventional methods could not control turning a kinetic interface roughening process from CCA to DLA. 3D-printers using AP-ICP focused beams might seem to be able to refurbish gas flow passages in TEL showerheads. But 3D-printer techniques suffer from porosity and permeability problems in the added silicon. They further suffer from mismatches in the buildup geometry, congestion of the rest of the gas hole, and exfoliation under thermal cycling.

Successful TEL silicon showerhead refurbishment requires a completely different process than we use herein for Applied Materials type aluminum gas distribution plates or the showerheads. Refurbishing of the passages of the Applied aluminum gas distribution plates is essentially a process of etching to remove contaminates, and depositing $Y_2O_3$ coatings on the gas flow passages walls for plasma corrosion protection.

Refurbishing eroded plasma etching process TEL-type silicon gas distribution plates or the showerheads requires an additive technology wherein the eroded cavities of the outlets of the gas flow passages are backfilled with vaporized silicon nanoparticles. These are delivered with a focused plasma beam and crystallize on the surface in the cavities. High temperature annealing is then delivered by the same beam during thermal cycling to fuse it.

The repetitive process adds silicon to the eroded outlets, and is followed by a repetitive removal of any extra material that penetrated too deep. The vertical structures in the original geometry are restored. Weakly disorganized aggregates that can cause porous cavity formations are flushed out. As such, our process resembles a modification of the so-called Borsch Process.

The Bosch Process is a high-aspect ratio plasma etching technique that cycles isotropic etching and fluorocarbon-based protection film deposition with quick gas switching. A $SF_6$ plasma cycle etches silicon, and a $C_4F_8$ plasma cycle creates a protection layer. The protection films have to be thick enough to withstand the highly anisotropic silicon etching in the $SF_6$ plasma cycle.

The conventional Bosch Process uses pulsed or time-multiplexed etching, it alternates repeatedly between two steps to rebuild (albeit not in silicon) what can be nearly vertical walls:

1. Etching is standard, nearly isotropic plasma based. The plasma includes ions that will attack the target wafer primarily vertically. Sulfur hexafluoride [$SF_6$] is commonly used for such silicon etching.

2. Depositing a chemically inert passivation layer. For instance, a $C_4F_8$ (Octafluorocyclobutane) source gas yields a passivation substance similar to Teflon.

Passivation layers are generally used to protect an entire substrate from supplemental chemical attacks and to stop excessive etching. However, during normal etching, directional ions that bombard the substrate can also carry the attack to the passivation layer down along trench bottoms. The sidewalls usually miss out. Directional ions collide with the passivation substance and sputter it off, exposing the bare substrate for chemical etching.

These small etch/deposit steps are repeated in then conventional Bosch Process many times to result in a large degree of isotropic etch taking place only at the bottom of the trenches and pits. Etching through a 0.5 mm silicon wafer, for example, would require 100-1000 small etch/deposit steps. The two-phase process can cause the vertical sidewalls to horizontally undulate with an amplitude of about 100-500 nm. The cycle times can be adjusted to control this effect. Short cycles are used to produce smoother walls, and longer cycles realize higher rates of etching.

These etch/deposit steps are widely used for chemical drilling of deep holes in silicon wafers and to mill various MEMS and through silicon via (TSV) technology nanostructures.

We have replaced the passivation process used in the Bosch technique with a our unique silicon deposition process in embodiments of the present invention. This is made possible by the focused AP-ICP plasma torch embodiments of the present invention and our novel top bias discharge. Bias lid 1628 is a key part, due to the electric field effects RF bias electrode 1630 has on the discharge below.

In one aspect, embodiments of the present invention include an AP-ICP plasma beam generation system connected to a silicon nanopowder delivery system, an extractor, an isolation lid with a lid-dropping mechanism, and a discharge chuck that holds a silicon showerhead. An auxiliary CCP discharge generating mesh is connected to receive a discharge gas supply. It is associated with a bias discharge generator and plasma coupling. A bias discharge 1634 discharge is ignited between the eroded side of the showerhead and the isolation lid. A ballistic deposition of silicon is directed to surface of the eroded outlets of the gas flow passages of the silicon showerhead.

In another aspect, embodiments of the present invention include an AP-ICP plasma beam generation system with a $SF_6$ delivery system, an extractor, an isolated lid and lid-dropping mechanism, and a discharge chuck holding a silicon showerhead. A ballistic deposition on the surface of the eroded outlets of the gas flow passages of the showerhead is converted into a nuclei-generation cloud deposition. A bias discharge 1634 discharge fills the eroded cavities in the barrel-shaped gas holes. Ballistic supersonic AP-ICP plasma beam flows carrying the silicon vapor enter this bias discharge and are decelerated. The silicon vapor spreads inside the eroded cavities, and the slowed-down vapors deposit on the sidewalls. Such process includes the nucleation of silicon layers on the silicon cavity surface, layer by layer in a thick coating of silicon.

In another aspect, embodiments of the present invention include a AP-ICP plasma beam generation system connected to an argon supply and generate an argon plasma beam. It further includes an extractor, an insulated lid with lid-dropping mechanism, and a discharge chuck to hold a silicon showerhead. The discharge chuck comprises an auxiliary CCP discharge mesh connected to a discharge gas supply. Penetrating, supersonic AP-ICP plasma beams carry $SF_6$ into the gas flow passages. The inside walls with a silicon buildup left during silicon deposition are cleaned by removing any weakly organized aggregates that could later exfoliate.

In another aspect, embodiments of the present invention include a AP-ICP plasma beam generation system connected to an argon-hydrogen gas supply to produce high temperature argon-hydrogen plasma beams. These too include an extractor, an isolated lid with a lid-dropping mechanism, and a discharge chuck to hold a silicon showerhead. This is used for annealing the deposited silicon now filling in the eroded cavities, and heated to crystallization and coalescence with the silicon substrate.

In other words, the conventional multi-cycle Bosch method is modified here to reconstruct the straight-hole geometry of gas flow passages with well formed bits of silicon. Our modification manifests as a new application of focused AP-ICP plasma beams combined with a bias discharge as a deceleration device to assist silicon deposition nucleation.

Silicon vapors carried by the AP-ICP plasma beam arrive too fast for deposition nucleation the barrel shaped areas of damaged and eroded cavities in the gas flow passage outlets. The supersonic silicon vapor stream must be slowed down, and we do that herein with the top bias discharge 1634 discharge.

When the silicon vapor carrying plasma beam 1624 collides with the bias discharge 1634, a cloud of vaporized silicon droplets results. The vaporized silicon droplets uniformly disperse inside the cavity in a deposition nucleation on the sidewalls. The bias discharge is sustained by a RF power applied to lid 1628 and electrode 1630. The opposite end of each gas flow passage 1636 receives an upward flow of ionized argon from a bottom auxiliary CCP discharge 200 that coupled with the bias discharge.

A straight-hole geometry reconstruction of the gas flow passages results from $SF_6$ gas etching carried in by the same plasma beam that removes debris in the center as well as on the inside walls. The rest of the gas flow passage is drained of loose etched silicon with a passivation gas flow from the supply via the cavity to the drain to keep the etch zones and deposition zones spatially divided.

The third cycle, annealing, uses the same focused AP-ICP plasma beam to carry a high temperature mixture of argon and hydrogen to bond each new layer of the silicon nano-coating to the barrel shaped gas hole erosion cavity and to the silicon substrate and the previous layer.

The delivery of ionized etching reactants to clean high aspect holes and then deliver vaporized $Y_2O_3$ nanoparticles into those holes is only possible if the plasma beam doing the work has a diameter less than the diameter of the hole.

Embodiments of the present invention depend on the unique property of nanoparticles to be melted and vaporized at the temperatures less than half that for bulk materials. But, that property can only be realized if nanoparticles less than twenty nanometers can be commercially obtained.

Herein we use a two-step thermal treatment of these nanoparticles, e.g., where the first step is to activate the surface energy by melting the nanoparticle shells. Then the liquidated surfaces will squeeze the internal energy. However, complete liquidation and vaporization of the core requires outside thermal energy.

Nanopowder-based coating systems should be equipped to deliver de-aggregated nanoparticles into the plasma, and then apply a pre-melting plasma reactor and a vaporizing reactor.

The refurbishing of showerheads includes: (1) chemical etching of the high aspect millimeter scale passages with hydrogen chloride gas to remove products of PECVD processing like organic contaminants; (2) Chemical etching by the ionized hydrogen for removing the product of plasma chemical reaction in PVD process like AlF3; (3) Deposition of vaporized Y2O3 on the inner wall of the passages; (4) Hydrogen annealing the amorphous $Y_2O_3$ to increase adhesion to the aluminum wall and cohesion inside the coating.

So, FIG. 17 represents a refurbishing system 1700 that includes two distinct and specialized AP-ICP system parts. The first is a one-stage etching and annealing system part 1710 to support hydrogen chlorine and hydrogen gas delivery. The generation of atmospheric pressure hydrogen plasma requires high levels of RF power to dissociate molecular hydrogen. So, a de-aggregator is included to dissociate molecular hydrogen into atomic hydrogen before it is ICP-heated into a hydrogen plasma beam 1712.

The second distinct and specialized AP-ICP system part is a two-stage plasma system part 1720 for $Y_2O_3$ nanoparticle deposition, and that outputs a nanoparticle vapor plasma beam 1722.

A vacuum chuck 1730 is shared by both of the distinct and specialized AP-ICP system parts 1710 and 1720 to hold and position the sample workpiece, e.g., an aluminum showerhead 1740. Vacuum chuck 1730 shares lid dropping subsystems 1731-1733 and 1736-1739. An auxiliary CCP discharge 1741-1744 is included with discharge chuck 1745.

A gas delivery system sends a mix of argon and 5% hydrogen chlorine for injection into the discharge chuck for double-sided etching of organic contaminants when cleaning the passages of aluminum gas distribution plates.

The deposition part 1720 functionally includes: (1) a nano-delivery unit 1751-1754 (2) a nanoparticle de-aggregator 1755, (3) a nanoparticle pre-heater 1756, (4) an AP-ICP nanoparticle pre-melting stage 1757-1761, (5) an AP-ICP nanoparticle vaporizing stage 1762-1766, (6) a nozzle 1767, and (7) an extractor 1768. A vacuum pump 1746 exhausts spent gases.

The staged plasma system 1700 include cluster de-aggregator 1755 followed by a spiral pre-heater 1756. Cluster de-aggregator 1755 serves to break up any nanopowder clusters in a dielectric barrier discharge, e.g., a multi-needle system powered from an RF generator 1757. The pre-heater 1756 at the entrance the AP-ICP plasma system part 1720 serves to (1) heat the argon carrier gas in order to prevent cooling of the top plasma torch, and (2) to lessen coupling between the dielectric barrier discharge 1755 and the AP-ICP discharge 1761.

The etching-annealing part 1710 functionally includes: (1) a hydrogen chloride delivery 1770-1771, (2) a selector valve 1772, (3) a hydrogen delivery 1773-1777, (4) a plasma reactor 1778-1782, (5) a nozzle 1783, and (6) an extractor 1784. Air cooling should be included. Gas delivery 1770-1772 provides for injection of 100% hydrogen chlorine into etching plasma beam 1712.

A five-axis motion system 1790-1794 is under program control of a hub 1795. Five-axis motion includes x-y-z motion, rotation, and tilt. (1) X—fine motion −8" Serves for programming motion and alignment of the holes with plasma beam; (2) X—coarse motion −10". Serves for programming motion of sample from etching zone to deposition one; (3) Y—motion −2". Serves for programming motion and alignment of the holes with plasma beam; (4) Z—motion 4". Serves for aligning the surface of sample with focal plane of the plasma optics; (5) Rotation—360-degree Serves for programming motion of sample from etching zone to deposition one; and (6) Tilt −10 degree to +35 degree Serves for oblique deposition of the non-flat surfaces.

Two-staged AP-ICP system 1700 is very useful in the deposition of $Y_2O_3$. Top stage 1757-1761 has its plasma reactor surrounded by top saddle antenna 1760 which has an applied RF power of 700-watts at a frequency of 27.12 MHz. It does the pre-melting of nanoparticles. Bottom stage 1762-1766 has its plasma reactor and joined to the nozzle 1767 with an orifice of roughly one millimeter. This lower plasma reactor is surrounded by bottom saddle antenna 1765 and has an applied RF power 2.7 kilowatts at a frequency of 13.56 MHz. This bottom stage 1766 provides for vaporization of the pre-melted first stage nanoparticles. Nozzle 1767 is joined to the bottom stage and serves to transition the plasma torch generated in this stage into a thin supersonic plasma beam of under one millimeter and eject it into the atmosphere through the orifice.

Each plasma system 1710 and 1720 has an extractor 1784 and 1768 to electrically focus plasma beams 1712 and 1722 on the inlets of the showerhead passages. Each is equipped with lids 1737 and 1733 to seal uninvolved gas deposition plate passages during our plasma beam penetration process. Each lid is made from silicon wafer with hole around two millimeters, and is aligned with the orifice in nozzles 1783 and 1767.

The general practice of plasma beam penetration of high aspect, small holes is complicated by Debye layer that prevents such penetration. The plasma beams dissipate in the inlets of passages. As shown herein, the Debye layer can be breached by generating an auxiliary plasma discharge with an RF generator connected to mesh 1743 positioned under showerhead 1740. Auxiliary discharge coupling with the Debye layer dissipates the spatial charge of this layer, and releases plasma beams 1722 and 1712 to carry in etching radicals and vaporized nanoparticles.

Although particular embodiments of the present invention have been described and illustrated, such is not intended to limit the invention. Modifications and changes will no doubt become apparent to those skilled in the art, and it is intended that the invention only be limited by the scope of the appended claims.

The invention claimed is:

1. A plasma device, comprising:

a plasma reactor that produces at least one plasma beam;

an extractor with an electric field that pulls the plasma beam from a nozzle in the plasma reactor and imparts a focus to the plasma beam while directing and focusing the plasma beam into an entrance of a through-hole on a first surface of a workpiece;

an auxiliary plasma reactor that generates a capacitively coupled plasma (CCP) discharge adjacent to a second opposite surface near an exit of the through-hole;

wherein, each plasma beam is enabled thereby to overcome Debye sheathing congestion and completely penetrate the through-hole from the entrance to the exit by the CCP discharge; and wherein deposition materials, etchants, solvents, and/or heat are thereby rendered deliverable inside the entire length of the through-hole from entrance to exit.

2. The plasma device of claim 1, wherein the plasma reactor comprises:

an atmospheric pressure, inductively coupled plasma (AP-ICP) torch with an upper plasma reactor coupled to a lower plasma reactor and comprising an upper quartz confinement tube between a first pair of planar spiral-coil RF antennas powered by a first source of radio frequency (RF) energy, and a lower quartz confinement tube between a second pair of planar spiral-coil RF antennas powered by a second source of RF energy.

3. The plasma device of claim 2, wherein the plasma reactor further comprises:
an input that receives nanopowders that are pre-melted in the upper plasma reactor, and then vaporized in the lower plasma reactor, and then delivered in the plasma beam through the nozzle and extractor and deposited to an inside wall of the through-hole in the workpiece.

4. The plasma device of claim 1, wherein:
the workpiece is an aluminum gas distribution plate with hundreds of through-holes as gas flow passages each on the order of one millimeter in diameter; and
wherein, the CCP discharge counteracts and undoes a Debye blockage of the gas flow passages within the aluminum gas distribution plate and drain them of Debye electron charge electrons such that the focused plasma beam is enabled to completely penetrate the inside walls of the gas flow passages well enough to etch, clean, heat, deposit a coating from a nanopowder vapor, and anneal the coating in sequence.

5. The plasma device of claim 4, wherein the plasma reactor further comprises:
a sheathing gas input;
a selectable discharge gas input that selects amongst argon, hydrogen, and hydrogen chloride to variously support an etch, clean, heat, deposit, and anneal sequence.

6. The plasma device of claim 5, further comprising:
a dielectric barrier discharge device that de-aggregates yttrium oxide nanopowders before they are input to the plasma reactor for pre-melting by the upper plasma reactor and vaporization by the lower plasma reactor.

7. The plasma device of claim 6, further comprising:
a plurality of focused plasma beams that simultaneously emit in parallel in a linear array from the plasma reactor and extractor;
wherein the plasma density and nanopowder vapor density of each of the plurality of focused plasma beams that are balanced by the RF antennas and nanopowder inputs to produce simultaneously uniform plasma spots and rates of nanoparticle deposition within several gas flow passages at once.

8. An aluminum gas distribution plate refurbishment system, comprising:
a plasma reactor that produces a plurality of plasma beams and that includes an atmospheric pressure, inductively coupled plasma (AP-ICP) torch with an upper plasma reactor coupled to a lower plasma reactor and comprising an upper quartz confinement tube between a first pair of planar spiral-coil RF antennas powered by a first source of radio frequency (RF) energy, and a lower quartz confinement tube between a second pair of planar spiral-coil RF antennas powered by a second source of RF energy;
a nanopowder input that receives nanopowders that are pre-melted in the upper plasma reactor, and then vaporized in the lower plasma reactor, and then delivered in the plasma beam and deposited to an inside wall of a corresponding through-hole in an aluminum gas distribution plate as gas flow passages each on the order of one millimeter in diameter;
a sheathing gas input and a selectable discharge gas input selectable amongst argon, hydrogen, and hydrogen chloride gases to variously support etching, cleaning, heating, depositing, and annealing of inside walls of the gas flow passages and in a sequence;
a dielectric barrier discharge device connected to de-aggregate yttrium oxide nanopowders before they are input to the plasma reactor for a more effective pre-melting by the upper plasma reactor and a more thorough vaporization by the lower plasma reactor;
an extractor that pulls each plasma beam from a nozzle in the plasma reactor and imparts a focus to the plasma beam while directing and focusing the plasma beam from above into an entrance of a through-hole on a first surface an aluminum gas distribution plate; and
an auxiliary plasma reactor that generates a capacitively coupled plasma (CCP) discharge just beneath the aluminum gas distribution plate adjacent to a second opposite surface near an exit of the through-hole;
wherein, the CCP discharge counteracts and unknots any Debye blockage of the gas flow passages within the aluminum gas distribution plate and drain them of Debye electron charge electrons such that the focused plasma beam is enabled to completely penetrate the inside walls of the gas flow passages well enough to etch, clean, heat, deposit a coating from a nanopowder vapor, and anneal the coating in sequence;
wherein, each plasma beam is enabled thereby to completely penetrate a corresponding through-hole from its entrance to its exit by contact with the CCP discharge;
wherein, a plasma density and a nanopowder vapor density of each of the plurality of focused plasma beams are balanced by alterations to the RF antennas and nanopowder inputs to simultaneously produce ultimately uniform plasma spots and rates of nanoparticle deposition within several gas flow passages.

9. A plasma device, comprising:
a source for generating a plasma at atmospheric pressures from a discharge gas of argon or molecular hydrogen and for confining that within an envelope of sheath gas, and for heating the discharge gas to a pre-melting plasma, and for immediately thereafter heating the discharge gas to a vaporizing plasma;
a top reactor for heating the pre-melting plasma in between a pair of top antennas driven by a first radio frequency power source;
a bottom reactor for heating the vaporizing plasma in between a pair of bottom antennas driven by a second radio frequency power source;
an output for emitting at least one plasma beam with an extractor from a nozzle;
means for pulling at least one of the plasma beams in a flow through from an entrance to a millimeter scale hole on one side of a workpiece through to an exit of the hole on an opposite side of the workpiece;
means for generating at the exit hole an auxiliary discharge of positive species ions from argon gas; and
an auxiliary plasma reactor that generates a capacitively coupled plasma (CCP) discharge just beneath an aluminum gas distribution plate adjacent to a second opposite surface near an exit of a through-hole.

* * * * *